(12) United States Patent
Baraskar et al.

(10) Patent No.: US 10,497,711 B2
(45) Date of Patent: Dec. 3, 2019

(54) NON-VOLATILE MEMORY WITH REDUCED PROGRAM SPEED VARIATION

(71) Applicant: SanDisk Technologies LLC, Plano, TX (US)

(72) Inventors: Ashish Baraskar, Santa Clara, CA (US); Liang Pang, San Jose, CA (US); Yanli Zhang, San Jose, CA (US); Raghuveer Makala, Campbell, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 36 days.

(21) Appl. No.: 15/846,620

(22) Filed: Dec. 19, 2017

(65) Prior Publication Data

US 2018/0122814 A1 May 3, 2018

Related U.S. Application Data

(62) Division of application No. 15/221,269, filed on Jul. 27, 2016, now abandoned.

(51) Int. Cl.
*H01L 27/1157* (2017.01)
*H01L 27/105* (2006.01)
(Continued)

(52) U.S. Cl.
CPC ...... *H01L 27/1157* (2013.01); *H01L 27/1052* (2013.01); *H01L 27/11565* (2013.01); *H01L 27/11582* (2013.01)

(58) Field of Classification Search
CPC ............ H01L 27/1157; H01L 27/1052; H01L 27/11565; H01L 27/11582
See application file for complete search history.

(56) References Cited

U.S. PATENT DOCUMENTS

| 5,774,400 A | 6/1998 | Lancaster et al. |
| 8,614,124 B2 | 12/2013 | Jenne et al. |

(Continued)

OTHER PUBLICATIONS

Restriction Requirement dated Sep. 21, 2018, U.S. Appl. No. 15/891,574, filed Feb. 8, 2018 by Baraskar et al.

(Continued)

*Primary Examiner* — Marc Anthony Armand
(74) *Attorney, Agent, or Firm* — Vierra Magen Marcus LLP

(57) ABSTRACT

A three-dimensional non-volatile memory is provided with reduced programming variation across word lines. The gate lengths of word lines decrease from the top to the bottom of the memory hole. Increased programming speeds due to a narrow memory hole are offset by a smaller gate length at corresponding positions. A blocking dielectric thickness may also be varied, independently or in combination with a variable word line thickness. The blocking dielectric is formed with a horizontal thickness that is larger at regions adjacent to the lower word line layers and smaller at regions adjacent to the upper word line layers. The larger thickness at the lower word line layers reduces the programming speed in the memory hole for the lower word lines relative to the upper word lines. A variance in programming speed resulting from differences in memory hole diameter may be offset by a corresponding variance in blocking dielectric thickness.

9 Claims, 43 Drawing Sheets

(51) Int. Cl.
*H01L 27/11565* (2017.01)
*H01L 27/11582* (2017.01)

(56) References Cited

U.S. PATENT DOCUMENTS

| | | | |
|---|---|---|---|
| 8,742,389 | B2 | 6/2014 | Lee |
| 8,847,304 | B1* | 9/2014 | Lee .................. H01L 29/792 |
| | | | 257/324 |
| 9,208,883 | B2 | 12/2015 | Alsmeier |
| 9,218,978 | B1 | 12/2015 | Ramkumar |
| 9,379,246 | B2 | 6/2016 | Shimabukuro |
| 9,449,985 | B1 | 9/2016 | Rabkin et al. |
| 9,450,023 | B1 | 9/2016 | Konevecki et al. |
| 9,646,880 | B1 | 5/2017 | Mine et al. |
| 9,741,768 | B1 | 8/2017 | Melik-Martirosian et al. |
| 2010/0019310 | A1 | 1/2010 | Sakamoto |
| 2010/0078701 | A1 | 4/2010 | Shim et al. |
| 2013/0193395 | A1 | 8/2013 | Lee |
| 2014/0362641 | A1* | 12/2014 | Dong .................. G11C 11/5642 |
| | | | 365/185.17 |
| 2014/0362642 | A1 | 12/2014 | Dong et al. |

OTHER PUBLICATIONS

U.S. Appl. No. 15/891,574, filed Feb. 8, 2018 by Baraskar et al.
U.S. Appl. No. 15/221,269, filed Jul. 27, 2016, by Baraskar et al.
Preliminary Amendment dated Mar. 2, 2017, U.S. Appl. No. 15/221,269, filed Jul. 27, 2016.
Restriction Requirement dated Apr. 3, 2017, U.S. Appl. No. 15/221,269, filed Jul. 27, 2016.
Response to Restriction dated May 25, 2017, U.S. Appl. No. 15/221,269, filed Jul. 27, 2016.
Restriction Requirement dated Jul. 7, 2017, U.S. Appl. No. 15/221,269, filed Jul. 27, 2016.
Response to Restriction Requirement dated Aug. 1, 2017, U.S. Appl. No. 15/221,269, filed Jul. 27, 2016.
Non-final Office Action dated Nov. 2, 2017, U.S. Appl. No. 15/221,269, filed Jul. 27, 2016.
International Search Report & The Written Opinion of the International Searching Authority dated Aug. 8, 2017, International Application No. PCT/US2017/034888 filed May 28, 2017.
U.S. Appl. No. 15/445,409, filed Feb. 28, 2017, by Baraskar et al.
Restriction Requirement dated Aug. 14, 2017, U.S. Appl. No. 15/445,409, filed Feb. 28, 2017.
Response to Restriction Requirement dated Oct. 10, 2017, U.S. Appl. No. 15/445,409, filed Feb. 28, 2017.
Non-final Office Action dated Nov. 16, 2017, U.S. Appl. No. 15/445,409, filed Feb. 28, 2017.
International Search Report & The Written Opinion of the International Searching Authority dated Aug. 8, 2017, International Application No. PCT/US2017/034890 filed May 28, 2017.

* cited by examiner

Fig. 1
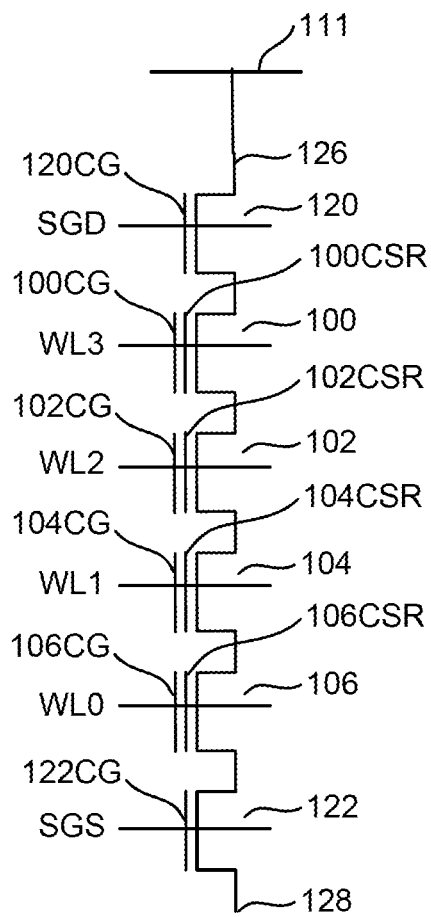
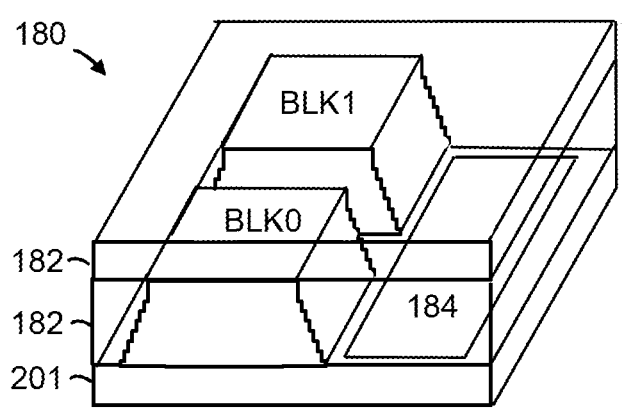
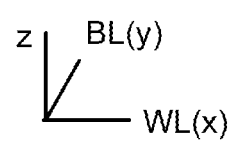
FIG. 2

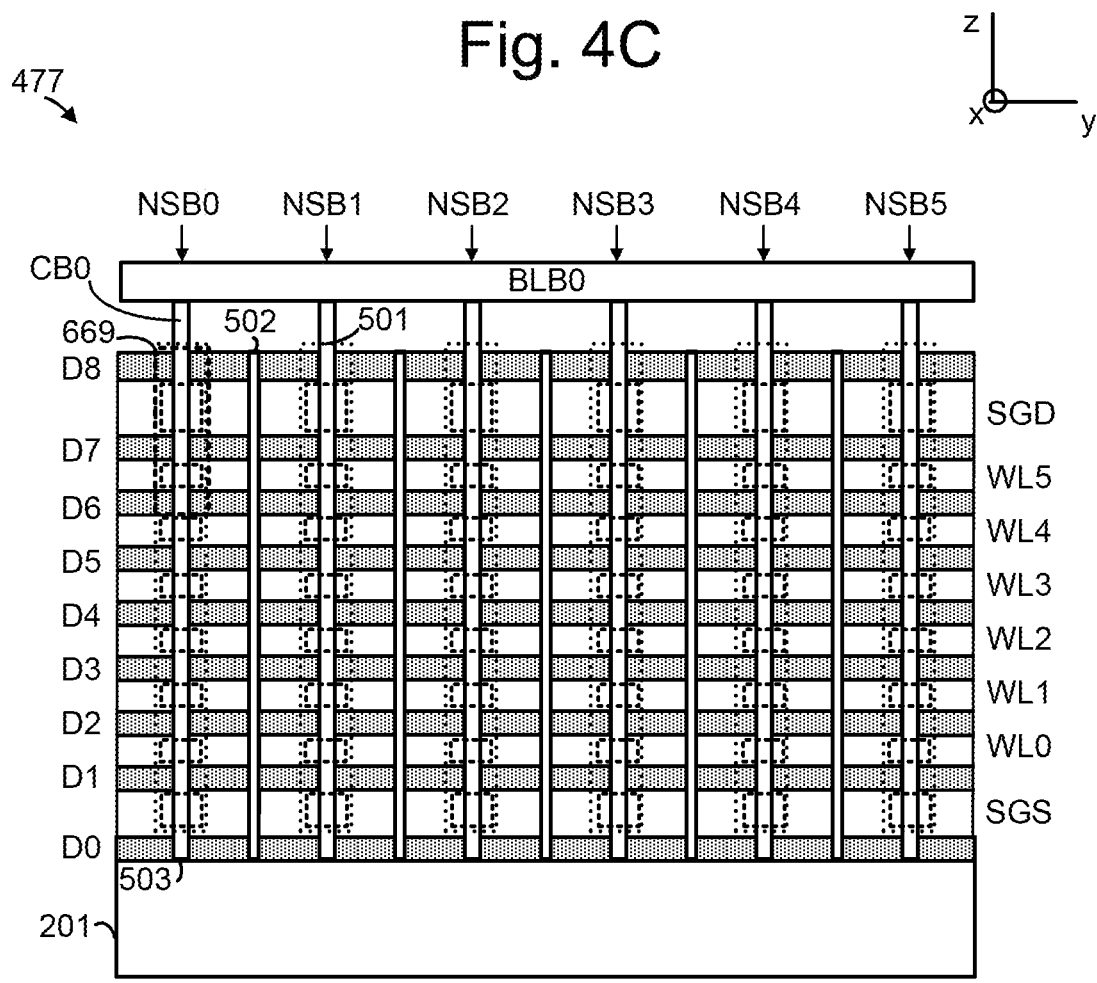

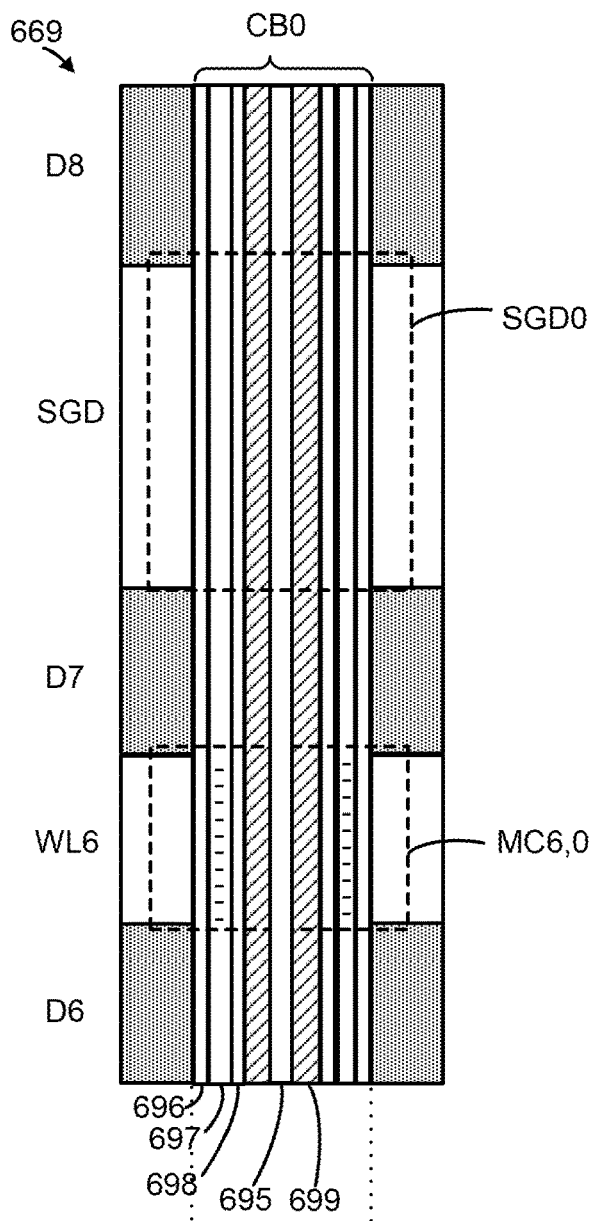
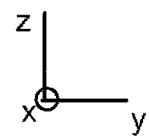
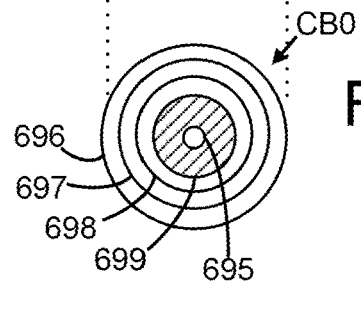
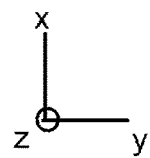
Fig. 5A
Fig. 5B

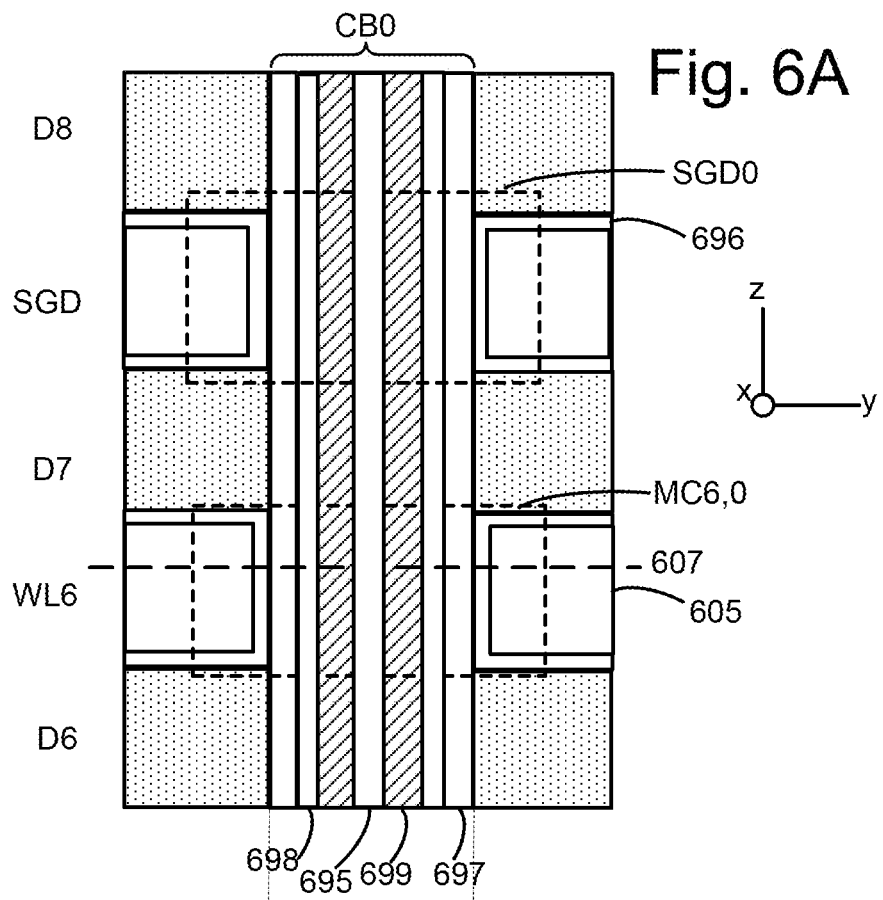
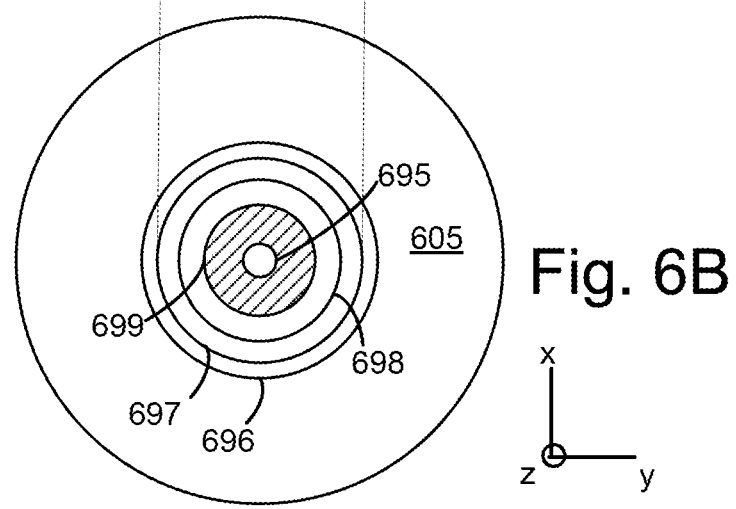

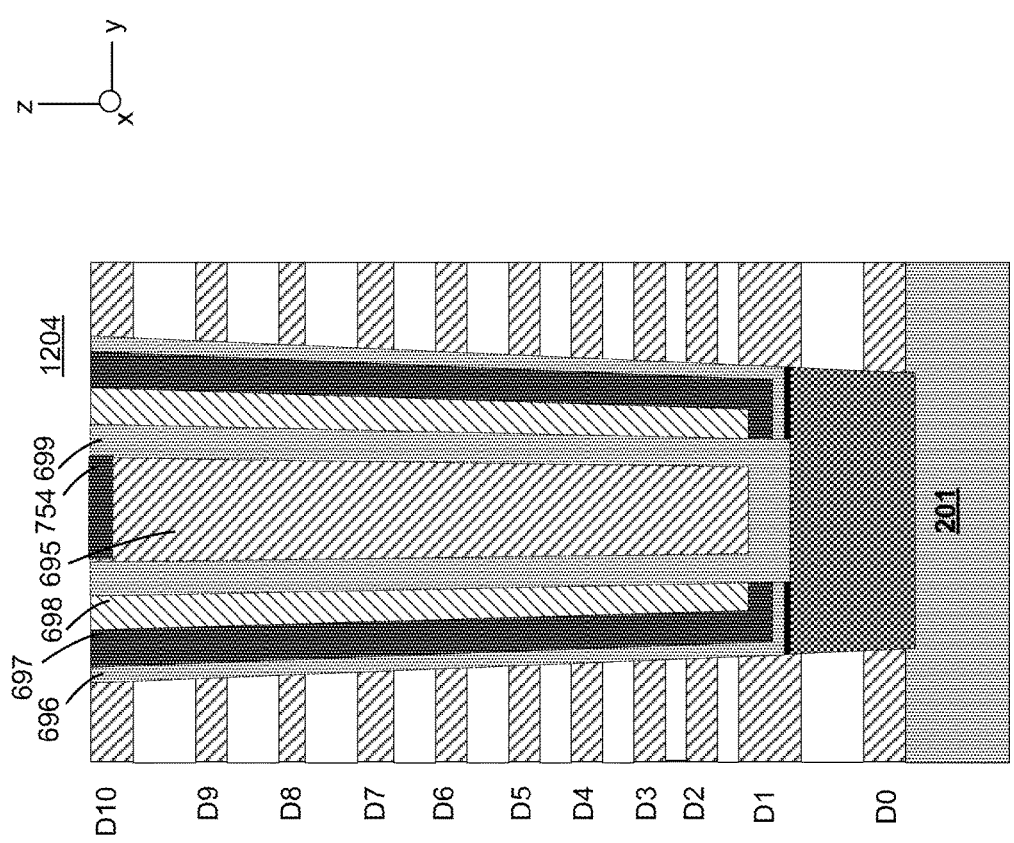

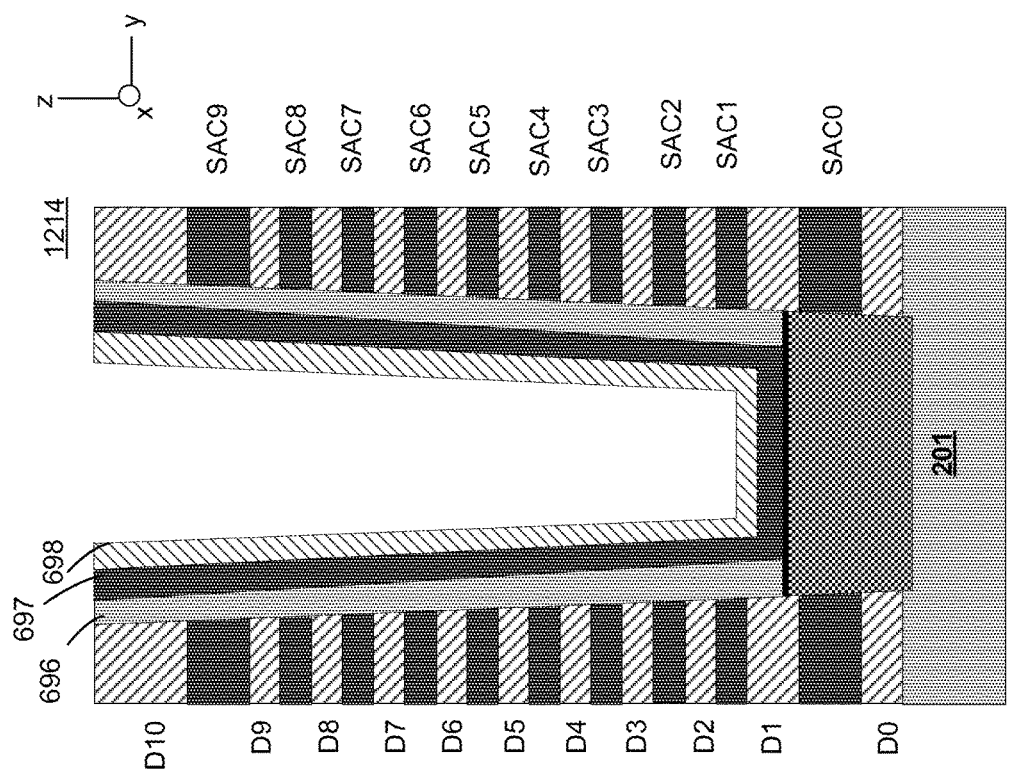

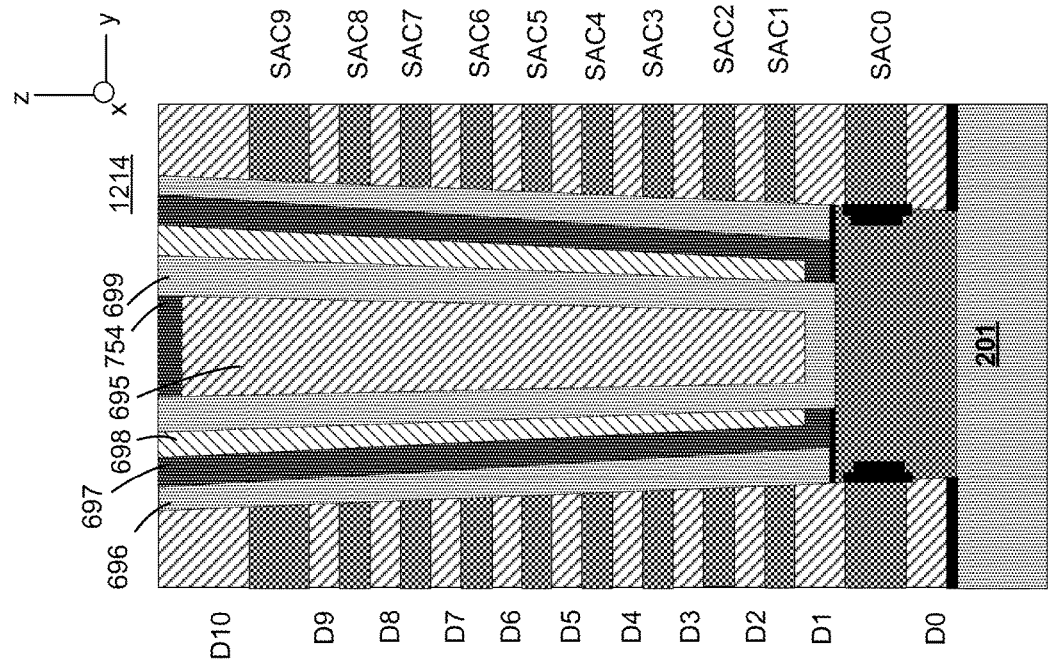
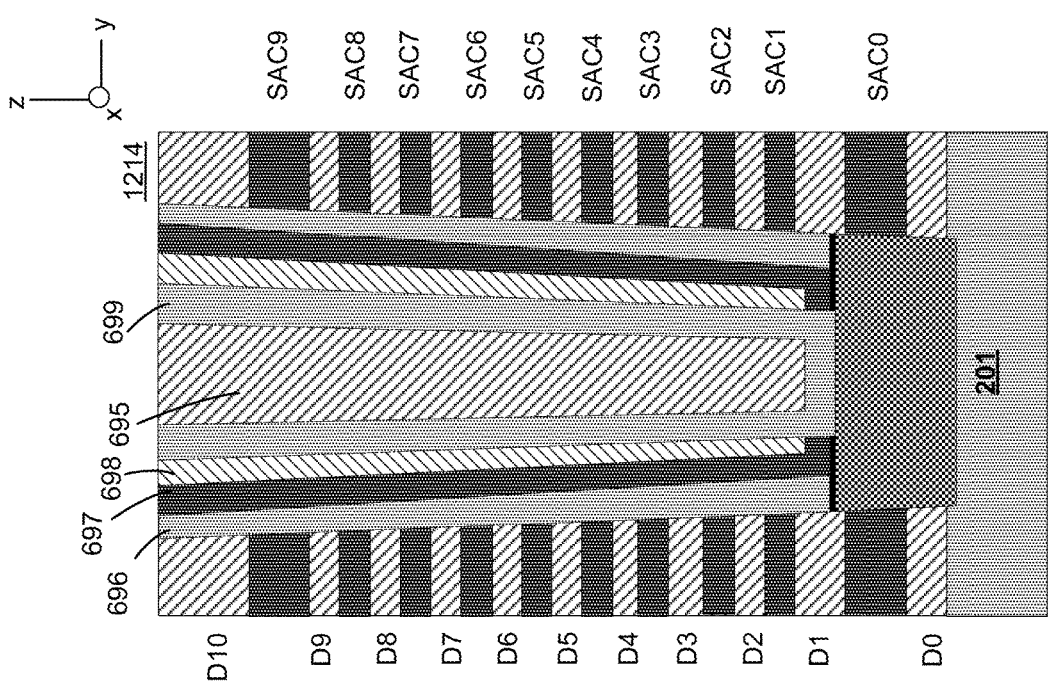

NON-VOLATILE MEMORY WITH REDUCED PROGRAM SPEED VARIATION

CLAIM OF PRIORITY

This application is a divisional application of U.S. patent application Ser. No. 15/221,269, entitled "NON-VOLATILE MEMORY WITH REDUCED PROGRAM SPEED VARIATION," filed Jul. 27, 2016 and published as US2018/0033794 on Feb. 1, 2018, and incorporated herein by reference in its entirety.

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Flash memory is among the most popular non-volatile semiconductor memories.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data is binary data.

A multi-state flash memory cell (storing multi-state data) is implemented by identifying multiple, distinct allowed threshold voltage ranges (ie data states). Each distinct threshold voltage range corresponds to a predetermined value for the set of data bits. For example, some memory cells can store two bits, and others can store three bits. The specific relationship between the data programmed into the memory cell and the threshold voltage ranges (also called data states) of the memory cell depends upon the data encoding scheme adopted for the memory cells. For example, U.S. Pat. No. 6,222,762 and U.S. Patent Application Publication No. 2004/0255090, both describe various data encoding schemes for multi-state flash memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. In order to achieve the advantage of higher memory capacity for a fixed die size, these smaller memory cells must be packed more closely together. Doing so, however, may result in a greater number of operational errors, such as errors when programming data to the memory and/or reading back user data from the memory. The errors may result in increased processing times to recover the data, or in some instances a corruption of data that has been stored.

Some systems have sought to combat read and programming errors by providing various compensations or other techniques to improve data reliability. Nevertheless, errors associated with programming and reading may continue to be seen.

BRIEF DESCRIPTION OF THE DRAWINGS

FIG. 1 is a circuit diagram of an example of a NAND string.

FIG. 2 is a perspective view of a 3D stacked non-volatile memory device.

FIG. 4C depicts a cross-sectional view of a block of a 3D non-volatile memory device having straight strings.

FIG. 5A depicts a close-up view of the region 669 of the column C0 of FIG. 4C, showing a drain-side select transistor SGD0 and a memory cell MC6,0.

FIG. 5B depicts a cross-sectional view of the column C0 of FIG. 5A.

FIGS. 6A and 6B depict an alternative embodiment to that of FIGS. 5A and 5B.

FIGS. 13A-13L are cross-sectional views depicting the results of the process of FIG. 12 in one embodiment.

FIGS. 16A-16F are cross-sectional views depicting the results of the process of FIG. 15 in one embodiment.

DETAILED DESCRIPTION

Figure 3A:
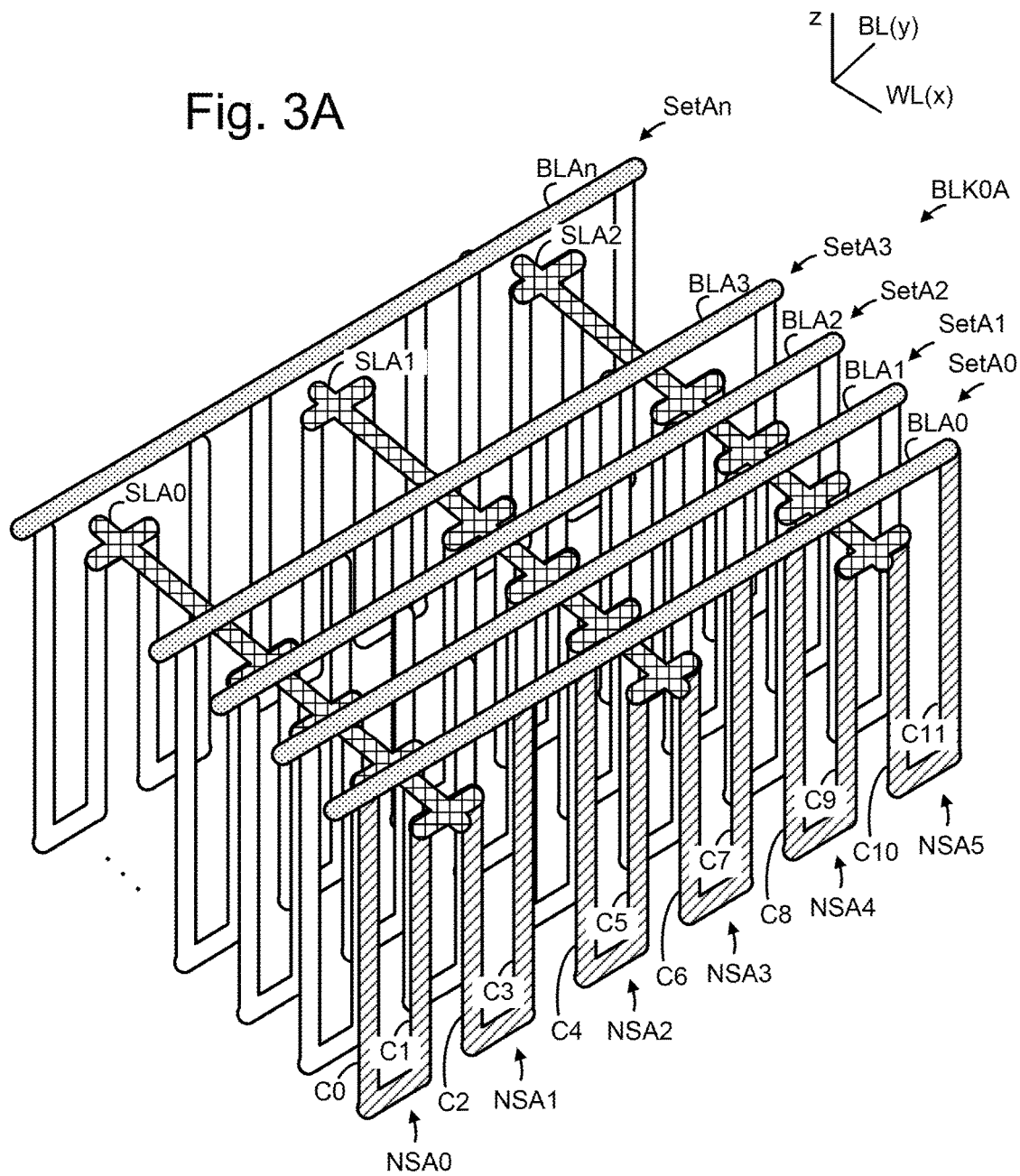
FIG. 3A depicts an embodiment of a block BLK0A of U-shaped NAND strings.

The disclosed technology is directed to reducing variations in programming in non-volatile memory. Different device dimensions between memory cells in a non-volatile memory array may result from the various fabrication processes used to complete a final device. These differences may arise naturally from the processes used in some cases. To reduce the effects of differences in device dimensions, non-volatile memories and related fabrication processes are provided that can reduce programming variations across memory cells in a non-volatile memory array. In one embodiment, a memory array is provided that includes word lines having a gate length or thickness that varies based on a corresponding dimension of a memory hole. In one embodiment, a memory array is provided that includes a blocking dielectric having a thickness that varies based on a corresponding dimension of a memory hole.

Three-dimensional (3D) non-volatile memory arrays are often fabricated using a memory hole which is formed in an array of alternating and conductive and dielectric layers. A NAND string, for example, may be formed by filling the memory hole with appropriate materials to form a straight NAND string which extends in one memory hole, or a U-shaped (or pipe-shaped) NAND string which includes a pair of vertical columns of memory cells which extend in two memory holes. Because of the fabrication processes used to form the memory hole, the memory hole diameter can vary along the vertical length or height of the hole. Typically, the diameter becomes progressively smaller from the top to the bottom (closer to the substrate) of the memory hole. Non-uniformity in the diameter of the memory hole may cause the programming speed of memory cells to vary based on their position along the memory hole. A smaller diameter memory hole causes a stronger electric field across the tunnel dielectric so that the programming speed is often higher.

In accordance with one embodiment, a three-dimensional non-volatile memory is provided having a stack of alternating word line and dielectric layers. The gate lengths of the word lines are varied based on the memory hole diameter at a position adjacent to a word line. The memory hole diameter decreases from the top of the memory hole (adjacent to the top word line) to the bottom of the memory hole (adjacent to the bottom word line)

The gate lengths of the word lines are selected to reduce variances in programming speed that may result from the differences in memory hole diameter. The word line gate length is smaller for the lower word line layers and larger for the upper word line layers. The smaller gate length causes a lower programming speed when compared to a larger gate length. Thus, by making the word line gate length smaller where the memory hole diameter is smaller, the programming speed for memory cells in this region can be normalized to match that of the other memory cells. The small gate length can counteract the effects of increased electric fields where the memory hole diameter is small.

The word lines are divided into zones in one embodiment with each word line in a zone having the same thickness or gate length. The word line thickness is smaller for the lower word line zones closer to the substrate surface and larger for the upper word line zones further from the substrate surface. The thickness is each zone is larger than the thickness of any zone formed over the zone and is smaller than the thickness of any zone formed under the zone. In another embodiment, each word line may have an individual thickness such that zones are not used.

In one embodiment, a blocking dielectric thickness is varied to reduce program speed variations. The blocking dielectric thickness may be varied alone or in combination with a variable word line thickness. A blocking dielectric is typically formed in the memory hole between the ends of the word lines and a charge trapping layer. In accordance with one embodiment, the blocking dielectric is formed with a horizontal thickness that varies based on the memory hole diameter. The blocking dielectric thickness is larger at regions adjacent to the lower word line layers and smaller at regions adjacent to the upper word line layers. The larger thickness at the lower word line layers reduces the programming speed in the memory hole for the lower word lines relative to the upper word lines. In this manner, the variance in programming speed resulting from differences in memory hole diameter may be offset by a corresponding variance in the blocking dielectric thickness.

One example of a non-volatile storage system that can implement the technology described herein is a flash memory system that uses the NAND structure, which includes arranging multiple memory cell transistors in series, sandwiched between two select transistors. The memory cell transistors in series and the select transistors are referred to as a NAND string. FIG. 1 is a circuit representation of a NAND string. The NAND string depicted in FIG. 1 includes four memory cell transistors 100, 102, 104 and 106 in series and sandwiched between (drain side) select transistor 120 and (source side) select transistor 122.

Select transistor 120 connects the NAND string to a bit line 111. Select transistor 122 connects the NAND string to source line 128. Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 1600CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Typically, each block may have a common source line. There may be a separate source line for each block. Bit lines may be shared with multiple NAND strings. The bit line may be connected to a sense amplifier.

The charge storage region (CSR) may utilize a non-conductive dielectric material to store charge in a non-volatile manner. The charge storage region may comprise one layer or several (e.g., three, four, or more) layers (or films) of different dielectric materials in one embodiment.

The memory cell transistor has a tunnel dielectric between the charge storage region and the channel of the memory cell transistor. Electrons can tunnel from the channel to the CSR during programming. The tunnel dielectric may include one or more different dielectric materials. In one embodiment, the tunnel dielectric comprises a single layer of silicon oxide (e.g., $SiO_2$). In one embodiment, the tunnel dielectric comprises a triple layer of silicon oxide (e.g., $SiO_2$), silicon nitride (e.g., $Si_3N_4$), and silicon oxide (e.g., $SiO_2$). The tunnel dielectric is not limited to these example materials.

The memory cell transistor has a control gate dielectric between the charge storage region and the control gate. The control gate dielectric may have one or more dielectric materials. The control gate dielectric is sometimes referred to as a "blocking dielectric" or "blocking oxide". The control gate dielectric region comprises $Al_2O_3$ as a blocking layer, which blocks un-desirable tunneling of electrons from CSR to control gate or from control gate to CSR, in one embodiment. The control gate dielectric could instead of, or in addition to, the $Al_2O_3$ comprise a silicon oxide (e.g., $SiO_2$) layer. The control gate dielectric is not limited to these example materials.

The cell is programmed by injecting electrons from the cell channel (or NAND string channel) into the CSR, where they are trapped and stored in a limited region. This stored charge then changes the threshold voltage of the cell in a manner that is detectable. The cell may be erased by injecting holes from the channel into the CSR where they recombine with electrons, and thereby "cancel" or reduce the stored charge. Cells may be also erased by extracting electrons from the CSR, e.g., by applying an electric field making electrons tunnel from the CSR to the channel. Cells may be erased by both these mechanisms combined.

One example of a 3D stacked memory structure having strings of memory cells is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

FIG. 2 is a perspective view of an example of a three dimensional (3D) stacked non-volatile memory device. The memory device 180 includes a substrate 201. On and above the substrate are example blocks BLK0 and BLK1 of memory cells (non-volatile storage elements). Also on substrate 201 is peripheral area 184 with support circuits for use by the blocks. Substrate 201 can also carry circuits under the blocks, along with one or more lower metal layers which are patterned in conductive paths to carry signals of the circuits. The blocks are formed in an intermediate region 182 of the memory device. In an upper region 182 of the memory device, one or more upper metal layers are patterned in conductive paths to carry signals of the circuits. Each block comprises a stacked area of memory cells, where alternating levels of the stack represent word lines. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device In one embodiment, NAND strings have a U-shape. In another embodiment, NAND strings have a straight shape. FIG. 3A depicts an embodiment of block BLK0 of FIG. 2 which includes U-shaped NAND strings. The block BLK0A includes U-shaped NAND strings arranged in sets (SetA0, . . . , SetAn, where there are n+1 sets of NAND strings in a block). Each set of NAND strings is associated with one bit line (BLA0, BLA1, BLA2, BLA3, . . . , BLAn). In one embodiment, each NAND string has a drain side select transistor that is able to connect/disconnect the NAND string from its bit line. The drain side select transistors in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 3B:
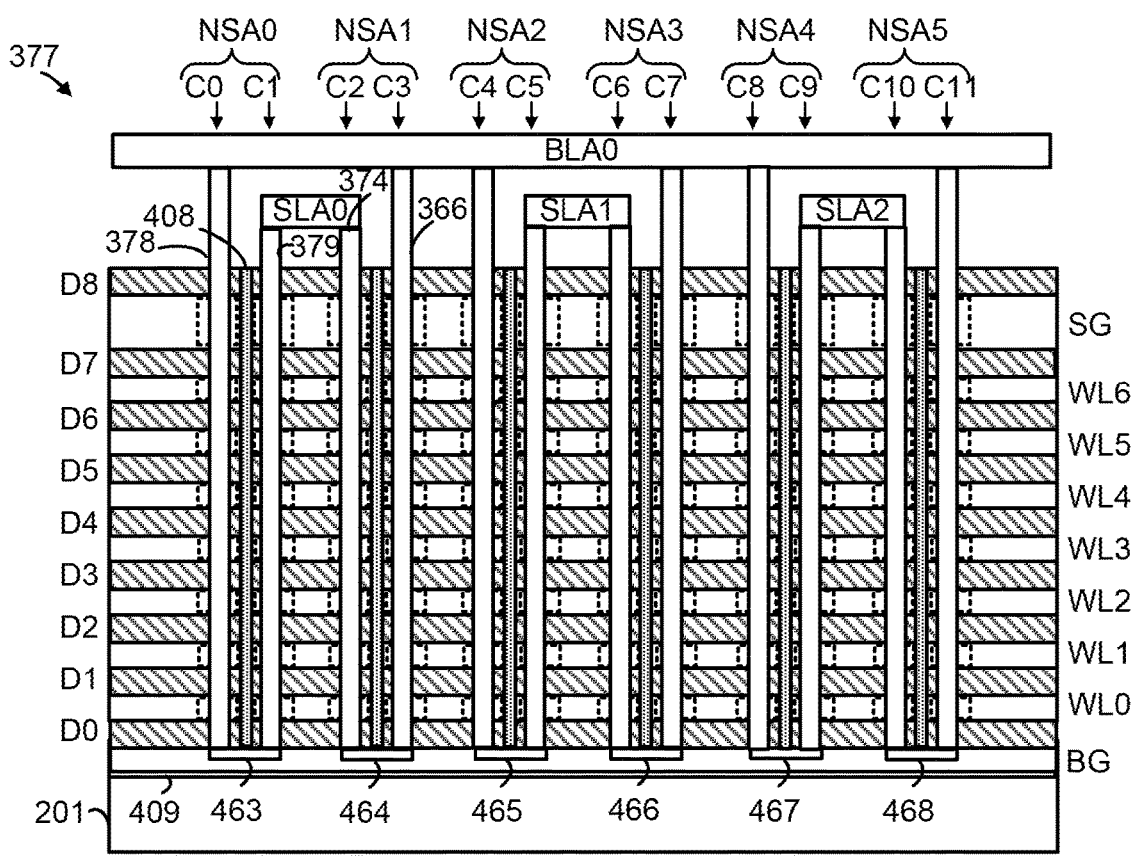
FIG. 3B depicts a cross-sectional view of a block of the 3D non-volatile memory device of FIG. 3A of SetA0 of NAND strings of FIG. 3A.

FIG. 3B depicts a cross-sectional view of a block of the 3D non-volatile memory device of FIG. 3A of SetA0 of NAND strings of FIG. 3A. Columns of memory cells C0 to C11 are depicted in the multi-layer stack. The stack 377 includes the substrate 201, an insulating film 409 on the substrate 201, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate when properly biased, allows the back gate transistor to connect, through the pipe connection, thus connecting the two columns of each U-shaped NAND string. For example, NSA0 includes columns C0 and C1 and connecting portion 463. NSA0 has a drain end 378 and a source end 379. NSA1 includes columns C2 and C3 and connecting portion 464. NSA1 has a drain end 366 and a source end 374. NSA2 includes columns C4 and C5 and connecting portion 665. NSA3 includes columns C6 and C7 and connecting portion 466. NSA4 includes columns C8 and C9 and connecting portion 467. NSA5 includes columns C10 and C11 and connecting portion 468.

The source line SLA0 is connected to the source ends 379 and 374 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 377 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 408 is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells (or memory cell transistors) and select transistors, as discussed further below. Thus, FIG. 3B shows strings (e.g., NAND strings) of non-volatile storage elements formed above the substrate 201 in multiple physical levels of a three-dimensional memory array. Each of the strings has an active area comprising a channel that extends vertically through the physical levels. Each string comprises non-volatile storage elements and a drain side select transistor in the SG layer.

Figure 4A:
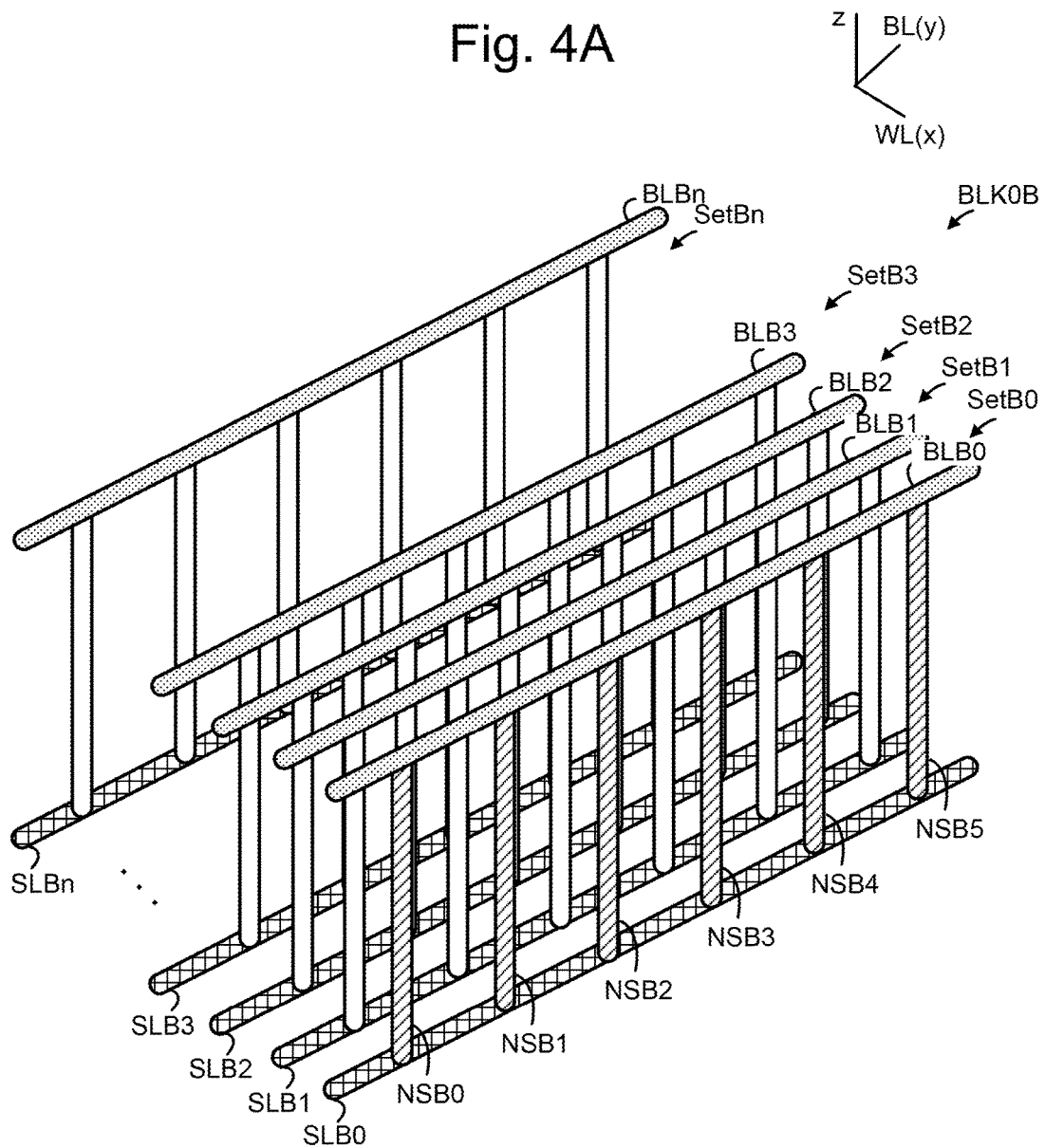
FIG. 4A depicts an embodiment of a block BLK0B of straight NAND strings.

FIG. 4A depicts an embodiment of block BLK0 of FIG. 2 which includes straight NAND strings. The block BLK0B includes straight NAND strings arranged in sets (SetB0, SetB1, SetB2, SetB3, . . . , SetBn, where there are n+1 sets in a block). Each set of NAND strings is associated with one bit line (BLB0, BLB1, BLB2, BLB3, BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 4B:
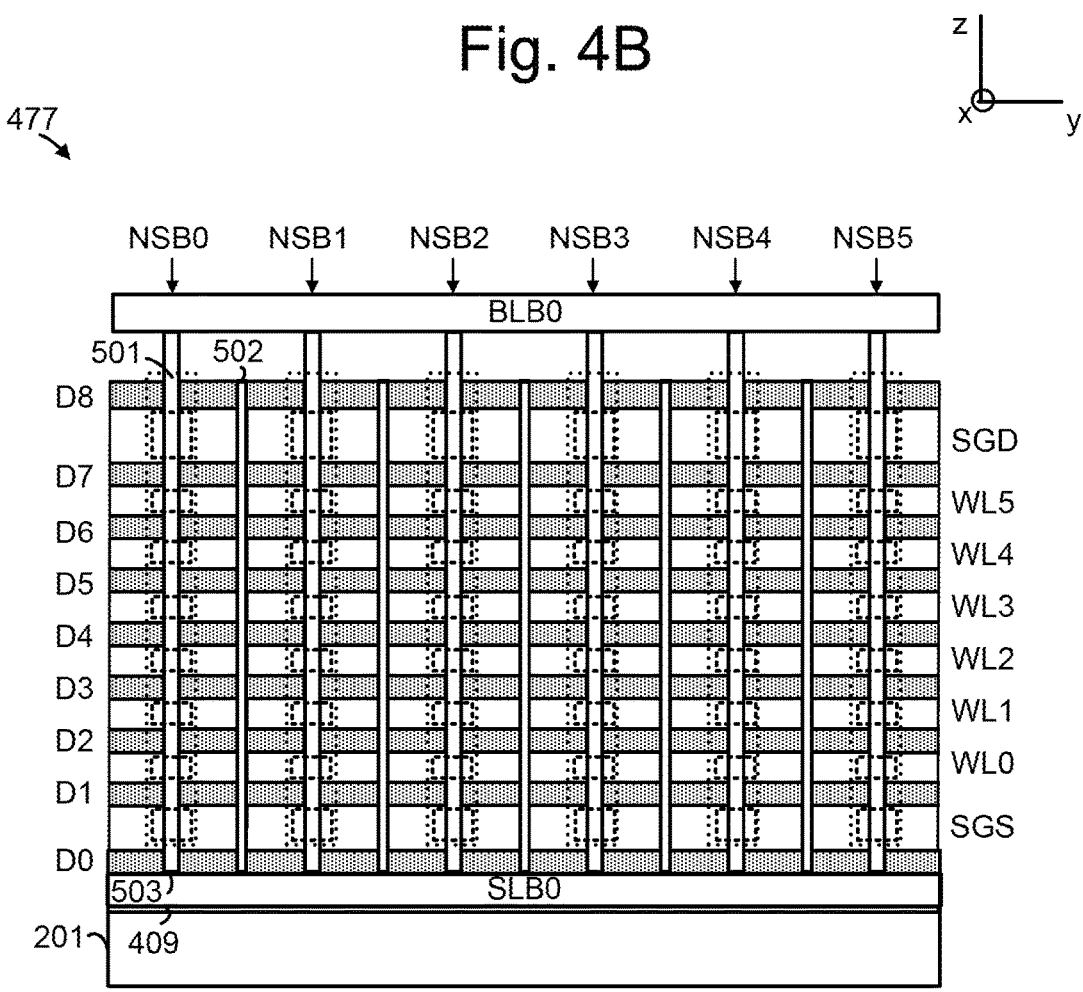
FIG. 4B depicts a cross-sectional view of a block of the 3D non-volatile memory device of FIG. 4A having straight strings.

FIG. 4B depicts a cross-sectional view of a block of the 3D non-volatile memory device of FIG. 4A having straight strings. The view is of a portion of setB0 of NAND strings of FIG. 4A. Columns of memory cells corresponding to NAND strings NSB0 to NSB5, respectively, are depicted in the multi-layer stack. The stack 477 includes a substrate 201, an insulating film 409 on the substrate, and a portion of a source line SLB0. Additional straight NAND strings in a sub-block may extend in front of and in back of the NAND strings depicted in the cross-section, e.g., along the x-axis. The NAND strings NSB0 to NSB5 may each be in a different sub-block, but are in a common set of NAND strings (SetB0). NSB0 has a source end 503 and a drain end 501. A slit 502 is also depicted with other slits. It is not required that there be a slit 502 between each pair of strings, as depicted. For example, slits could be used to separate blocks. Slits could be placed between several groups of strings within a block. In this case, a group of strings separated by slits within a block may be referred to as a "finger". There may be several fingers within a block. A portion of the bit line BLB0 is also depicted. Dashed lines depict memory cells and select transistors, as discussed further below.

FIG. 4C depicts a cross-sectional view of a block of another embodiment of a 3D non-volatile memory device having straight strings. This embodiment differs from that of the embodiment of FIG. 4B in that the source end 503 of the NAND strings does not directly contact the source line. Instead, the source end 503 of the NAND string is in direct physical contact with the semiconductor substrate 201. The semiconductor substrate 201 may be silicon. The source line is not depicted in FIG. 4C. A region 669 of the stack that includes column CB0 is shown in greater detail in FIG. 5A.

FIG. 5A depicts a close-up view of region 669, which includes column CB0 of FIG. 4C, showing a drain-side select transistor SGD0 and a memory cell MC6,0 (also referred to as "memory cell transistor"). FIG. 5B depicts a cross-sectional view of the column CB0 of FIG. 5A. The region 669 shows portions of the dielectric layers D6 to D8 and the conductive layers WL6 and SGD.

Each column includes a number of regions, 695 696, 697, 698, 699. Region 696 is a control gate dielectric (also referred to as a "blocking oxide"). The portion of word line WL6 that is adjacent to region 696 serves as the control gate for memory cell MC6,0. Region 697 is the charge storage region (CSR). Region 698 is the tunnel dielectric region. Region 699 is the semiconductor channel. Region 695 is an optional core dielectric.

A variety of techniques could be used to form the regions, 695 696, 697, 698, 699. One technique is to drill memory holes into horizontal layers of some material and then fill those memory holes. Note that the memory holes are not necessarily drilled into the horizontal material depicted in FIG. 5A. One option is to first have a sacrificial material instead of the conductive layers WL6 and SGD. After drilling the memory holes and filling the memory holes to form the column, the sacrificial material can be replaced with conductive material for WL6 and SGD. Some of the layers might be formed using atomic layer deposition. For example, a block oxide (or blocking layer) can be deposited on vertical sidewalls of the memory hole as layer 696, several dielectric layers can be deposited as layer 697, and a tunnel dielectric (or tunneling layer) can be deposited as layer 698. It is not required that all of these layers be formed in the column. An example is discussed below in FIG. 6A in which the blocking layer is not a part of the column.

The charge trapping region 697 comprises one or several layers of different materials in different example. The block oxide layer 696 and the tunnel dielectric layer 698 may each be formed from one or several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel dielectric layer 698 comprises a stack of oxide, nitride and oxide films. Additional memory cells are similarly formed throughout the columns.

When a memory cell such as depicted in FIG. 5A is programmed, electrons are stored in a portion of the charge trapping layer which is associated with the memory cell. For example, electrons are represented by "-" symbols in the charge trapping region 697 for MC6,0 in FIG. 5A. These electrons are drawn into the charge trapping region from the semiconductor channel 699, and through the tunnel dielectric 698. The threshold voltage of a memory cell is increased in proportion to the amount of stored charge.

During one embodiment of an erase operation, a voltage in the NAND channel may be raised due to GIDL, while a voltage of one or more selected word line layers floats. GIDL may occur due to high potential difference between bit line bias and bias applied on SGD to the control gate of the drain side transistor, and similarly, between source line bias and bias applied on SGS to the control gate of the source side transistor. The voltage of the one or more selected word line layers is then driven down sharply to a low level such as 0 V to create an electric field across the tunnel dielectric which may cause holes to be injected from the memory cell's body to the charge trapping region and recombine with electrons. Also, electrons can tunnel from the charge trapping region to the positively biased channel. One or both of these mechanisms may work to remove negative charge from the charge trapping region and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel dielectric is relatively small, and no, or very little, hole tunneling will occur. If word lines are floated, they will be electrically coupled to the NAND channel. As a result their potential will rise resulting in low potential difference between NAND channel and respective word lines. Memory cells of the unselected word lines will experience little or no Vth downshift, and as a result, they will not be erased. Other techniques may be used to erase.

FIGS. 6A and 6B depict an alternative embodiment to that of FIGS. 5A and 5B. FIG. 6A shows similar layers D6, WL6, D7, SGD, and D8, as were depicted in FIG. 5A. A memory cell MC6,0 and a drain side select transistor SGD0, are shown. Note that in this embodiment, the column CB0 has charge trapping region 697, tunnel dielectric layer 698, and the semiconductor channel 699. However, in the embodiment of FIGS. 6A and 6B, the blocking layer 696 is located outside of the column CB0. The blocking layer 696 has a portion that is in direct contact with charge trapping region 697. The blocking layer 696 has an optional portion above and below the word line 605. This optional portion results from one embodiment of the fabrication process in which after forming the column, sacrificial material is removed where the word line and blocking layer are to be formed. Then, the blocking layer 696 is deposited, followed by depositing the word line 605. FIG. 6B shows a cross section of FIG. 6A along line 607.

Note that the size of the memory holes may impact the operating voltages due to what may be referred to as "the curvature effect". The smaller the radius of the memory hole, the greater the curvature. Greater curvature may lead to higher electric fields. Thus, if the radius of the memory hole is increased, this may lead to lower electric fields. These lower electric fields may lead to the need for higher operating voltages. Therefore, if the radius of the memory hole is larger, higher operating voltages may be needed.

Figure 7:
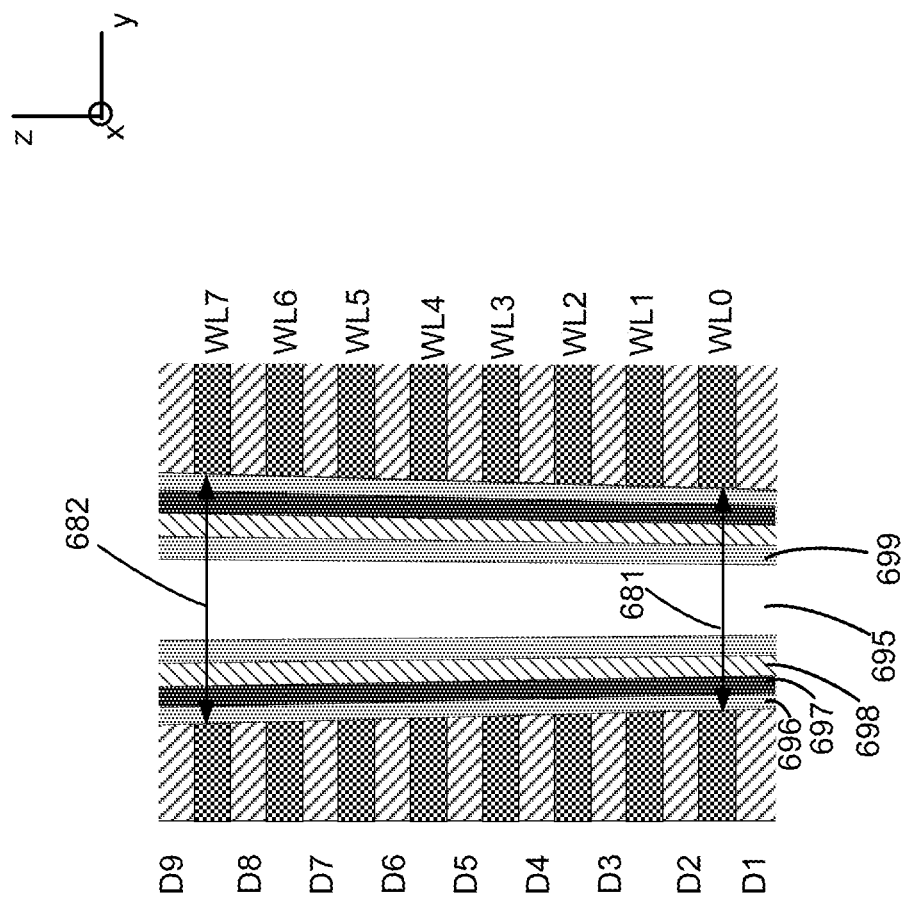
FIG. 7 is a cross-sectional close-up view of a memory hole having a diameter that varies with a vertical distance from a substrate surface.

FIG. 7 is a cross-sectional view showing a more detailed view of a portion of a memory hole MH formed in a word line stack. Memory hole MH is formed through a stack including word line layers WL0-WL7 formed alternatingly with dielectric or insulating layers D0-D8. It is noted that a memory hole MH is considered to be present in a final device even though it is later filled with various materials as shown.

Memory hole MH has a varying diameter which becomes progressively and gradually smaller from the top of the stack to the bottom of the stack. The memory hole is columnar and extends from at least a top word line layer (e.g., WL7) to a bottom word line layer (e.g., WL0). At a top region of the memory hole adjacent to word line WL7, the memory hole has a diameter labeled 682. At a bottom region of the memory hole adjacent to word line WL0, the memory hole has a diameter labeled 681. The diameter at the top is larger than the diameter at the bottom as a result of the fabrication of the memory hole. Due to the very high aspect ratio, the memory hole becomes narrower toward the bottom of the memory hole, becoming progressively smaller from the top to the bottom of the memory hole. It is noted that a slight widening may occur at some regions.

The non-uniformity of the memory hole causes the programming speed of the memory cells to vary based on their position in the memory hole. Where the diameter is smaller toward the bottom of the hole, the electric filed across tunnel oxide 698 is stronger, so that the programming speed is higher. The smaller hole size concentrates the electric field resulting in stronger or faster programming. Thus, the memory cells adjacent to the word lines can be expected to have programming speeds that decrease progressively and gradually from the bottom (WL0) to the top (WL7) of the memory hole.

Figure 8:
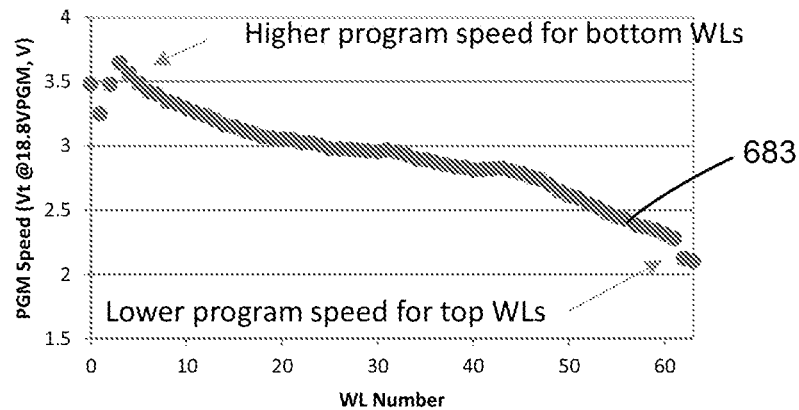
FIG. 8 is a graph depicting programming speed based on word line position.

FIG. 8 is a graph illustrating the differences in programming speed that may result from differences in memory hole diameter in a NAND string having sixty four (64) lines. The programming speed, represented as the threshold voltage after application of a 18.8V programming pule, is shown along the y-axis and the word line number is shown along the x-axis. Line 683 illustrates that the programming speed gradually decreases from word line 0 to word line 63

Figure 9:
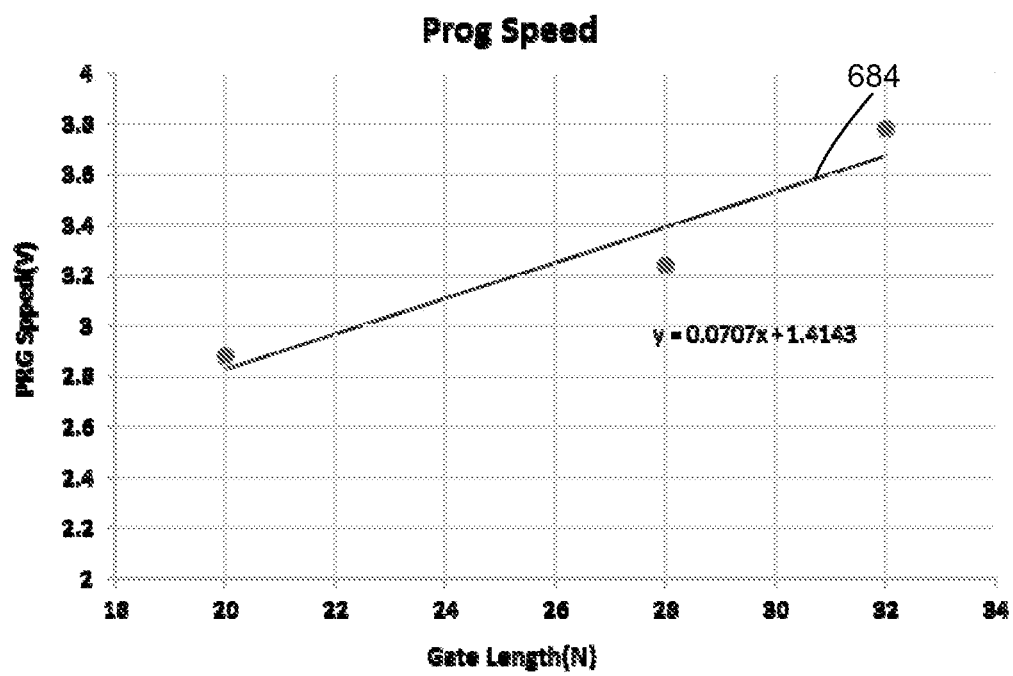
FIG. 9 is a graph depicting programming speed based on word line gate length.

The programming speed of a memory cell may also vary based on the gate length of the control gate or word line. Word lines with a longer gate length have a higher programming speed while word lines with a shorter gate length have a lower programming speed. FIG. 9 is a graph illustrating the effect of gate length on programming speed for memory cells. The programming speed as shown along the y-axis and the gate length is shown along the x-axis. Line 684 illustrates that the programming speed increases as the gate length is increased. The gate length in a stacked three dimensional structure is defined by the vertical thickness (relative to the substrate surface) of the word line layer.

Figure 10:
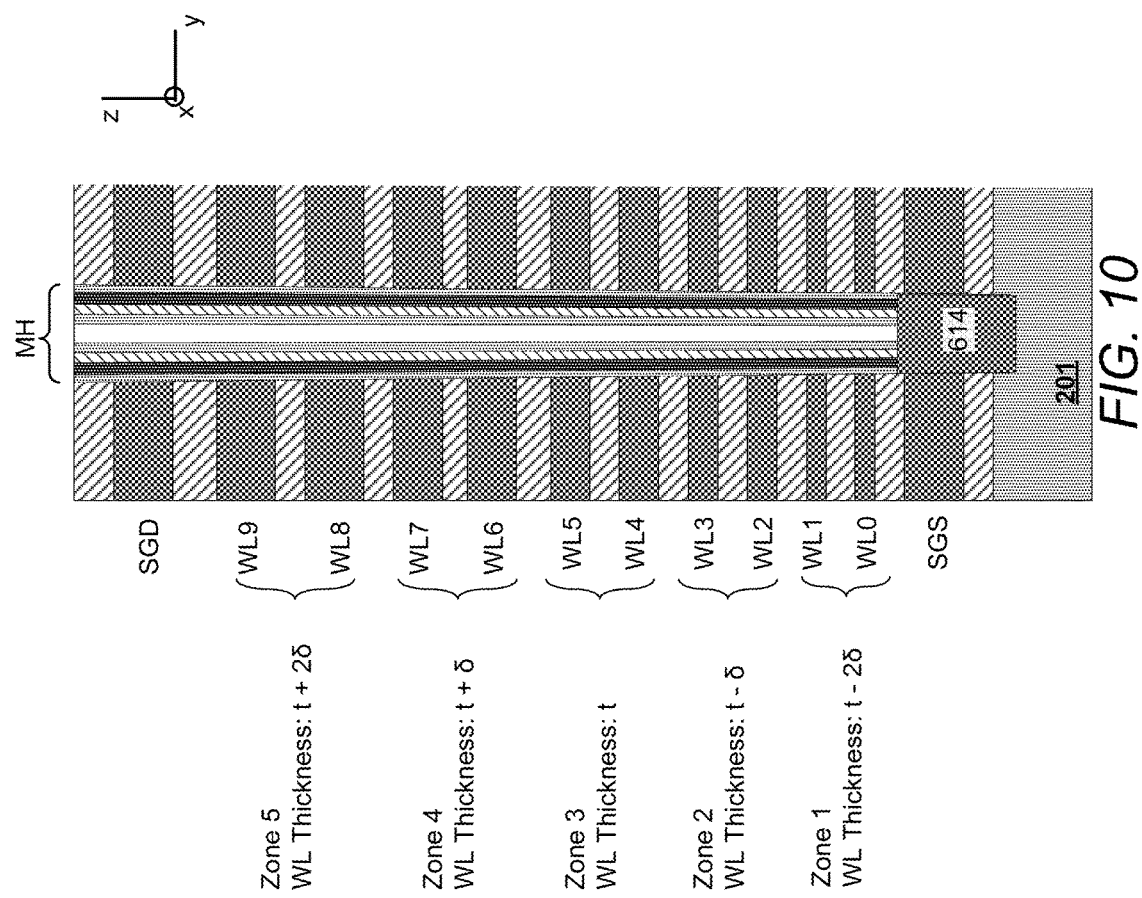
FIG. 10 is a cross-sectional view of a portion of a 3D stacked memory array having word lines with a gate length that varies with a vertical distance from a substrate surface in one embodiment.

FIG. 10 is a cross-sectional view of a portion of a stacked three-dimensional memory array in accordance with one embodiment. The thickness of the word line layers is varied based on the diameter of the memory hole adjacent to the word line. In this example, the word lines are divided into zones 1-5 where each word line in a zone is formed with the same thickness. The thickness of the word lines in each zone varies such that the thickness for each word line increases from the bottom to the top of the memory hole. In this particular example, zone 3 is shown as having a nominal or target thickness t which may correspond to a desired operating condition, etc. of the device. Word lines WL4 and WL5 in zone 3 are formed with a thickness of t. Zone 2 includes word lines WL2 and WL3 and is formed immediately below zone 1. Word lines WL2 and WL3 are formed with a thickness of t−δ, where δ represents an offset from the target thickness t. Thus, word lines WL2 and WL3 have a thickness that is less than that of word lines WL4 and WL5. Zone 1 includes word lines WL0 and WL1 and is formed immediately below zone 2. Word lines WL0 and WL1 are formed with a thickness of t−2 δ. Thus, word lines have a thickness that is less the thickness of word lines WL2-WL5. In one embodiment, δ is equal to 3.5 nm however, the actual value of δ can vary by implementation.

Zone 4 includes word lines WL6 and WL7 which are formed immediately above the word lines in zone 3. Word lines WL6 and WL7 are formed with a thickness t+δ. Thus, word lines WL6 and WL7 have a thickness and gate length that is larger than that of the underlying word lines WL0-

WL5. Zone 5 includes word lines WL8 and WL9 which are formed immediately above the word lines in zone 4. Word lines WL8 and WL9 are formed with a thickness t+2δ. Thus, word lines WL8 and WL9 have a thickness and gate length that is larger than that of the underlying word lines WL0-WL7.

The increase in word line thickness corresponds with the increase in memory hole diameter. In this fashion, the programming speed can be controlled to reduce variances along the memory cells of a NAND string. The thickness of a word line is smaller to correspond with a smaller memory hole diameter where the electric field during programming is strong. The thickness of a word line is larger to correspond with a larger diameter where the electric field during programming is weaker. Accordingly, the programming speed can controlled to be more consistent and predictable despite variances in the memory hole dimensions.

Many variations of word line thicknesses to define word line gate lengths may be used. For example, the value of δ does not have to be the same for all zones. For example, the thickness variation between zone 5 and zone 4 may be different than the thickness variation between zone 4 and zone 3, etc. Additionally, any number of zones can be used. For example, every word line can have a different thickness in one embodiment. In another embodiment, two zones can be used with all of the word lines having one of two thicknesses.

By way of example, FIG. 10 illustrates a first word line layer (e.g., WL1) that is formed below a second word line layer (e.g., WL2). Word line WL1 has a thickness and therefore gate length that is smaller than the thickness and gate length of word line WL2. The first word line is formed at a first level above the substrate 201 and the second word line is formed at a second level above the substrate 201. The first level is a smaller distance from the surface of substrate 201 than the second level.

Figure 11:
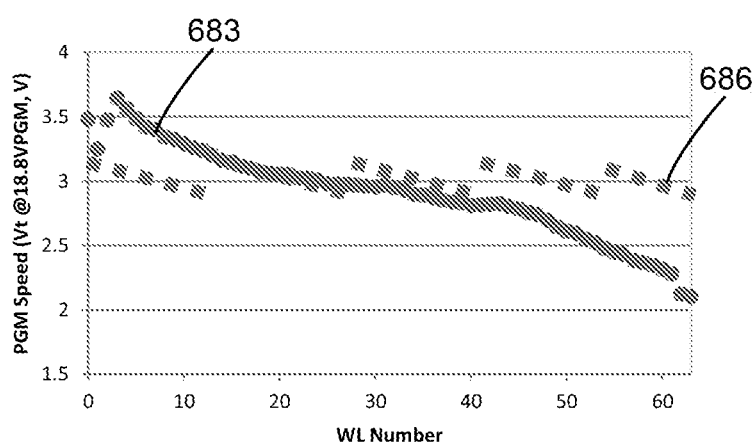
FIG. 11 is a graph comparing the programming speed of a traditional memory device with a memory device having word line zones with different thicknesses.

FIG. 11 is a graph showing the programming speed for a group of word lines coupled to a memory hole having a diameter that is smaller at the bottom and larger at the top. Line 683 illustrates that the programming speed gradually decreases from word line 0 to word line 63 when the word lines have the same thickness. Line 686 shows the results when the word lines have thicknesses that vary based on the memory hole diameter. Line 686 continues with the example of FIG. 10 where the word lines are divided into five zones. Each zone is formed with a thickness that is larger than that of the zones below it. Line 686 illustrates that the memory cells show a more consistent programming speed across the word lines. The zones can be seen in line 686 by the grouping of the memory cells. For example word lines 0-13 correspond to zone 1, word lines 14-26 correspond to zone 2, word lines 27-39 correspond to zone 3, word lines 40-52 correspond to zone 4, and word lines 53-63 correspond to zone 5. It can be seen that the word lines in each zone exhibit a similar programming behavior. Programming for the word lines in zone 1 is decreased from its programming speed shown by line 683 due to decreasing the word line gate length. Programming for the word lines in zone 2 is slightly decreased due to decreasing the word line gate length by a smaller amount. Programming for the word lines in zone 3 is about the same. Programming for the word lines in zones 4 and 5 is increased due to increasing the gate length of the word lines in these zones.

Figure 12:
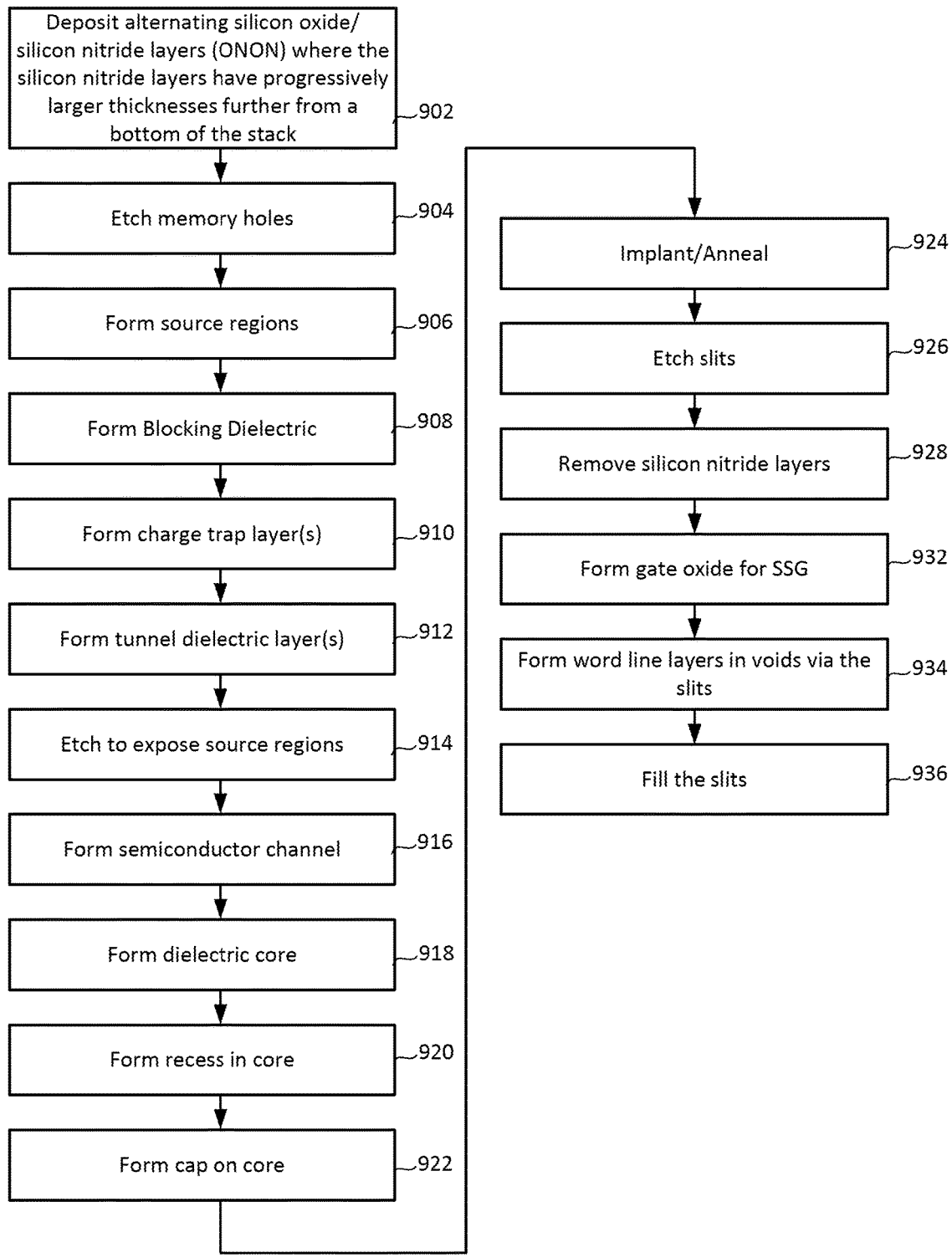
FIG. 12 is a flowchart describing a process of a fabricating a memory device with variable word line thicknesses in one embodiment.

FIG. 12 is a flowchart of one embodiment of a process of fabricating a memory device having a variable word line thickness based on a corresponding memory hole diameter. The process may be used for fabricating a 3D memory array (such as 3D NAND). Devices such as, but not limited to, those depicted in FIGS. 2, 3A, 3B, 4A, 4B, and 4C can be fabricated. Straight NAND strings in a 3D memory array can be fabricated in one embodiment. U-shaped NAND strings in a 3D memory array can be fabricated in one embodiment. Note that steps may be performed in a different order than presented in the flowchart. FIGS. 13A-13L depict the results of various process steps outlined in FIG. 13. Various modifications can be made. Moreover, other steps which are known from the art of semiconductor fabrication but are not explicitly depicted here may also be performed. FIG. 12 represents a "word line last" technique in which the word lines are formed after forming the NAND strings. For example, after forming the NAND strings, sacrificial silicon nitride may be replaced, at least in part, with metal.

Prior to step 902, below-stack circuitry and metal layers may be formed in the substrate. Various circuits may be formed in the substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance.

At step 902, alternating silicon oxide ($SiO_2$)/silicon nitride (SiN) layers are deposited above the substrate 201. The silicon nitride is a sacrificial layer, which will be replaced by metal to form word lines (as well as a source select line (SGS), and a drain select line (SGD or SG). The silicon oxide will be used for the insulating layers between the metal word (and select) lines. Other insulators can be used instead of silicon oxide. Other sacrificial materials could be used instead of silicon nitride.

The sacrificial layers for the word lines are formed with a thickness that varies with a distance of the sacrificial layer from the substrate surface. The sacrificial layers, which will later be removed to form word lines in their place, are formed with a smallest thickness for the lowest word line closest to the substrate surface and with a largest thickness for the highest word line furthest from the substrate surface. Thus, the sacrificial layers are formed with a progressively larger thickness from a bottom of the stack. In one embodiment, a thicker layer may be formed by using a longer deposition time when forming the corresponding word line layer. Other techniques may be used to adjust the thickness of the individual sacrificial layers.

Figure 13A:
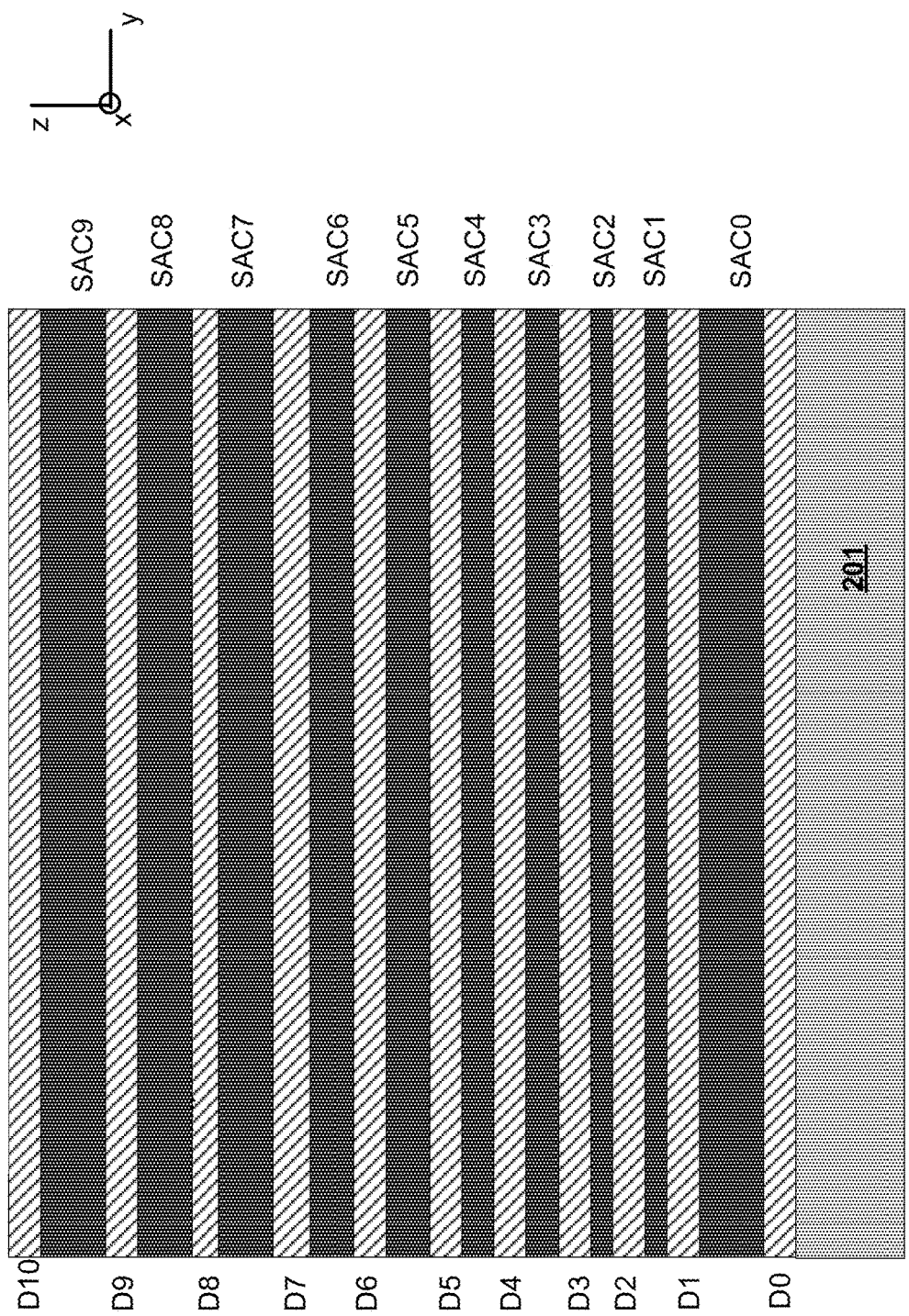

FIG. 13A depicts the results of step 902 in one embodiment. Sacrificial nitride layers SAC0-SAC9 have been formed alternatingly with dielectric layers D0-D10 over a semiconductor substrate to form a stack 1200. Sacrificial layer SAC0 will eventually become the SGS layer, and sacrificial layer SAC9 will eventually become the SGD layer. Sacrificial layers SAC1-SAC8 will eventually become word lines WL0-WL7. In this particular example, sacrificial layers SAC1 and SAC2 have a first thickness, sacrificial layers SAC2 and SAC4 have a second thickness that is larger than the first thickness, sacrificial layers SAC5 and SAC6 have a third thickness that is larger than the second thickness, and SAC7 and SAC8 have a fourth thickness that is larger than the third thickness. Sacrificial layers SAC0 and SAC9 can be formed with various thicknesses. In this example, SAC0 and SAC9 have a thickness than is larger than the fourth thickness of SAC7 and SAC8. Dielectric layers D0-D10 have the same thickness in FIG. 13A but different thicknesses for the dielectric layers could also be used.

At step 904, memory holes (MH) are etched in the stack of alternating layers of silicon nitride and silicon oxide. Reactive ion etching can be used to etch the memory holes. In the memory array area, the memory holes are placed densely. For example, the memory holes can have a diameter of 70-110 nanometers (nm) (70-110×10$^{-9}$ meters). This is an example range; other ranges could be used. Etching the memory holes creates a tapered profile to the memory holes such that the diameter is progressively smaller toward the bottom of the memory hole.

Figure 13B:
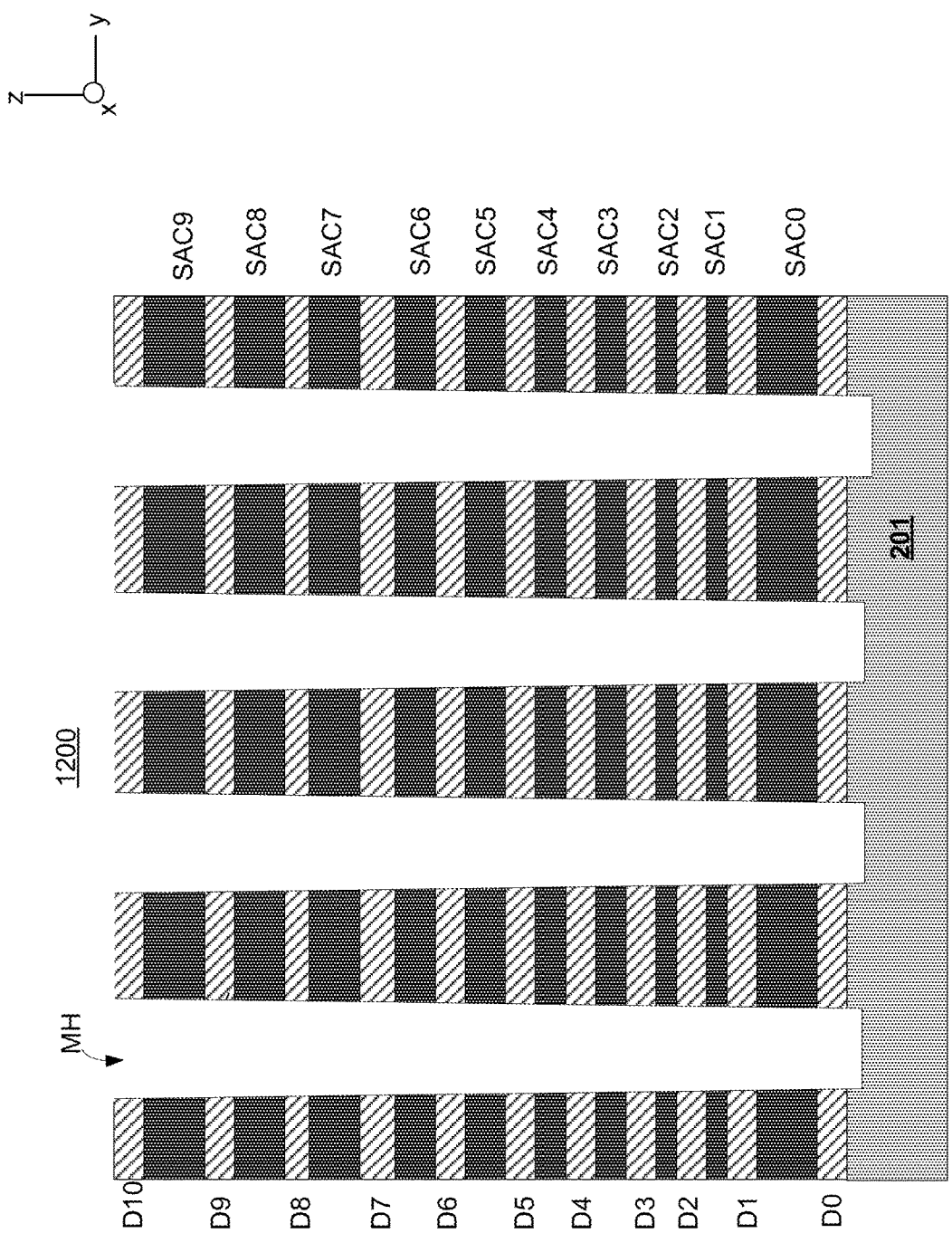

FIG. 13B shows the results of step 904 in one embodiment. Memory holes MH have been etched into the stack and extend vertically through the alternating sacrificial SAC0-SAC9 and insulating layers D0-D10. The memory holes extend fully through the stack to the semiconductor substrate 201, which is formed from silicon in one embodiment. Etching the memory holes may etch partway into the semiconductor substrate 201. An x-y-z coordinate system is depicted, showing the direction of formation. The memory holes have a major axis that is parallel to the z-axis.

Figure 13C:
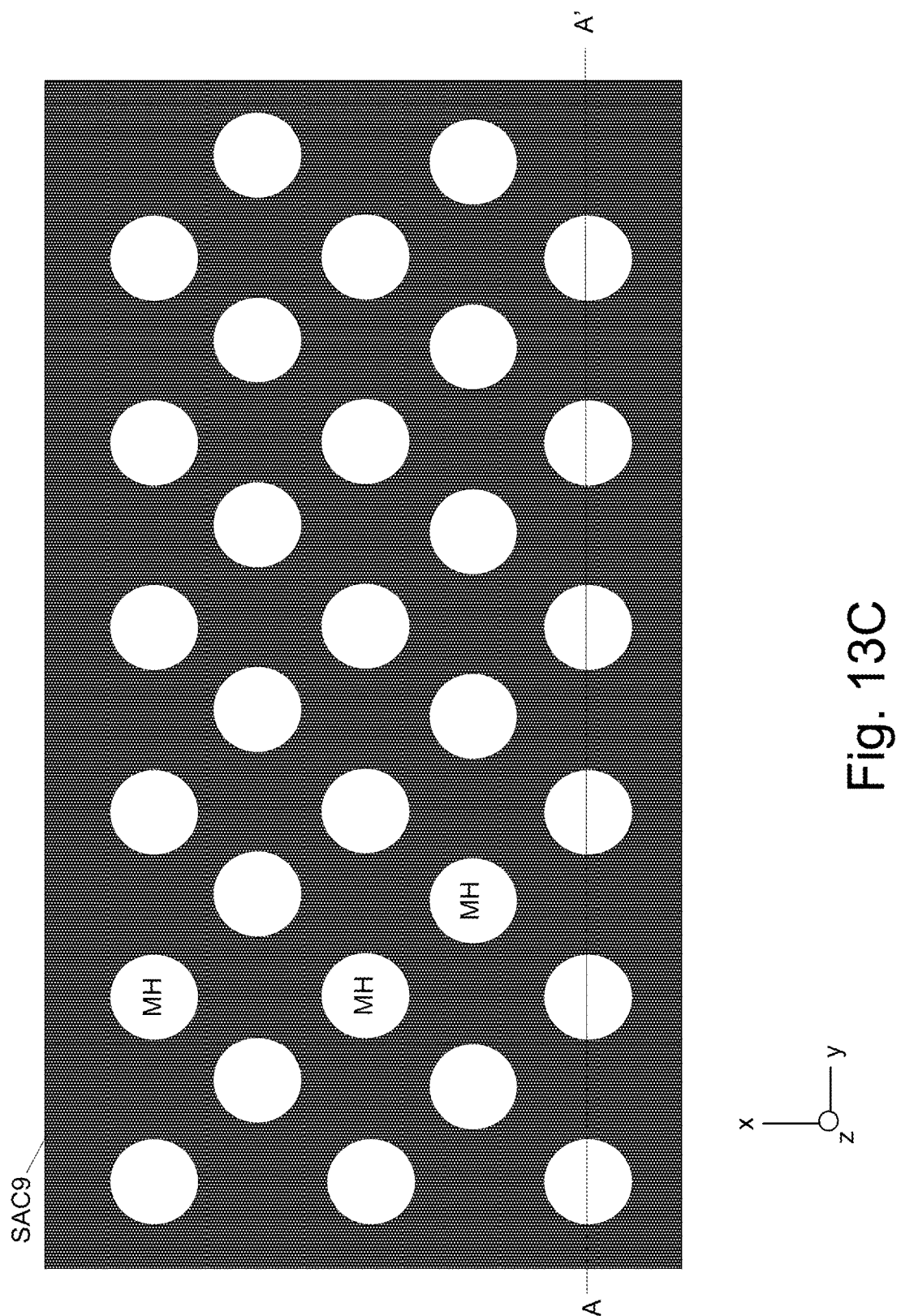

FIG. 13C is a top view after step 904, showing one possible pattern for the memory holes (MH). An x-y-z coordinate system is depicted, showing that direction of formation. Note that line A-A' indicates that FIG. 13A is a cross section along line A-A' of FIG. 13C. Also note that the memory holes have a circular cross section in the horizontal direction (e.g., x-y plane), in this example. The memory holes are not required to be circular in cross section. Note that the memory holes could be of different diameter in the different layers. For example, the memory holes may have a smaller diameter at the lower layers as described. Moreover, the pattern of FIG. 13C is not the only possible pattern. For example, the memory holes do not need to be staggered as depicted.

At step 906, source regions are formed in the memory holes. Silicon is formed at the bottom of the memory holes for the source side select transistor bodies. In one embodiment, the silicon is mono-crystalline silicon. Step 906 includes epitaxial silicon growth at the bottom of the memory holes, in one embodiment. In one embodiment, precursors such as dichlorosilane (DCS) and HCl are used. Step 906 includes two sub-steps, in one embodiment. In a first sub-step, a bake in hydrogen is performed. This bake may be at about 750 to 950 degrees Celsius and may be for between about ten seconds to 150 seconds. As one example, the hydrogen gas flow rate is about 10 to 50 sccm. As one example, the pressure may be about 10 to 30 mTorr. Also, a nitrogen gas flow may be used to mitigate unintentional nucleation sites on nitride corners. The nitrogen gas flow may be about 10 to 50 sccm. This optional nitrogen gas flow step passivates dangling silicon bonds prior to epitaxial silicon growth. The vertical sidewalls of the memory holes may have unintentional nucleation sites. The unintentional nucleation sites may be dangling silicon bonds. Passivating the dangling silicon bonds helps to prevent unintentional growth of silicon on the vertical sidewalls of the memory holes. Such growth could potentially block the memory hole during the formation of materials in the memory holes. The entire growth process may be carried out in a Chemical Vapor Deposition (CVD) technique (single wafer process or batch).

Figure 13D:
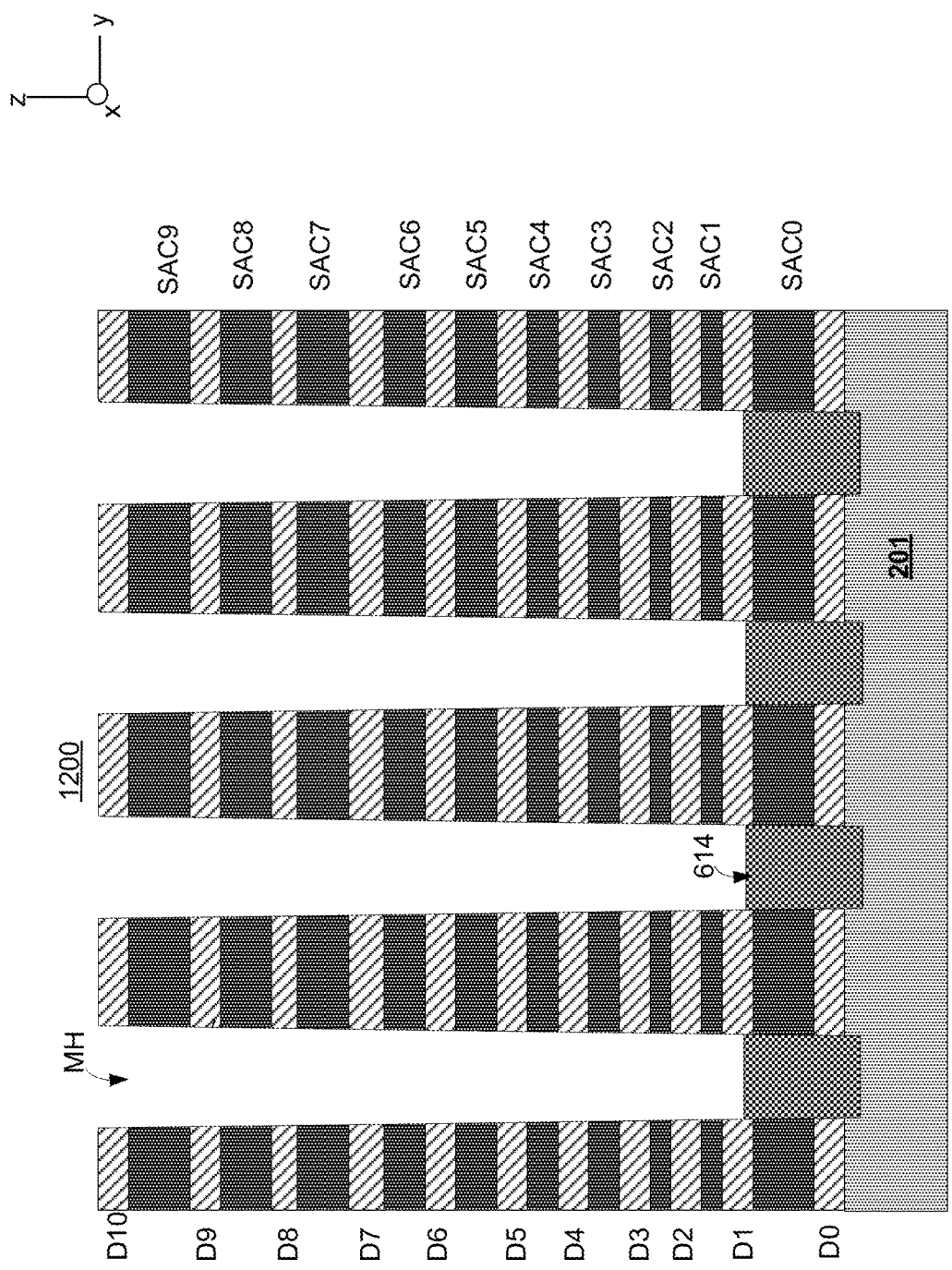

FIG. 13D depicts the results of step 906 in one example, showing mono-crystalline silicon region 614 in the bottom of the memory holes (MH). Note that silicon region 614 will serve as the body of the source side select transistor.

Figure 13E:
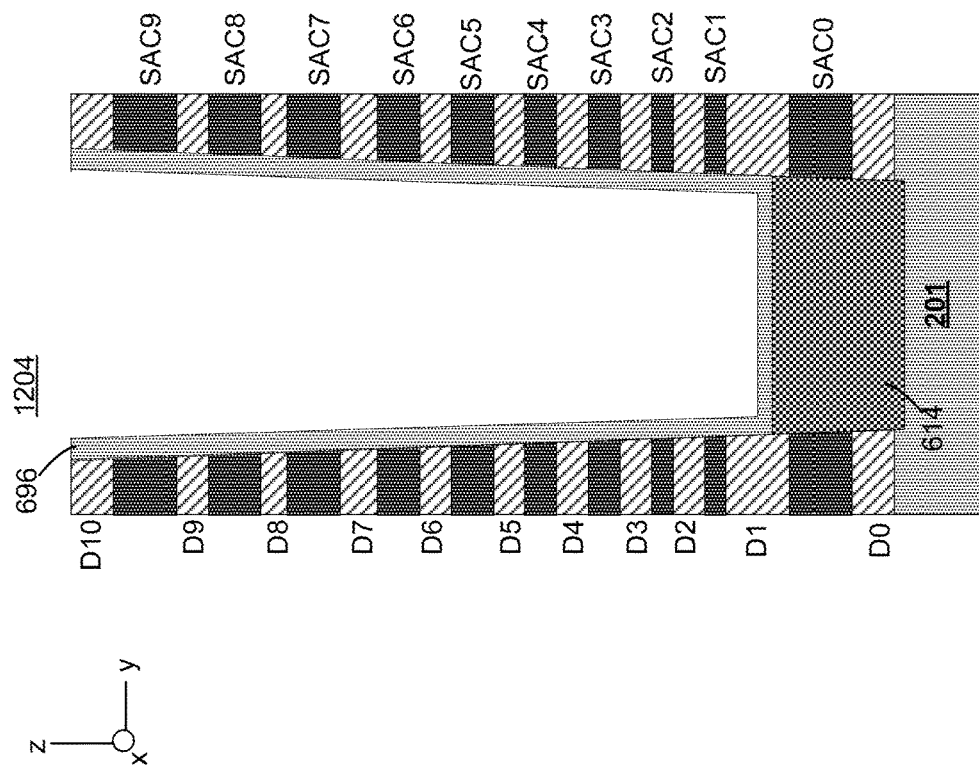

At step 908, the blocking dielectric is formed. In one embodiment, step 908 includes forming an oxide blocking dielectric but other materials may be used. The blocking dielectric may include one or more blocking dielectric layers. The blocking dielectric may include an $Al_2O_3$ and an $SiO_2$ layer in one example. Together, the two layers make up the blocking dielectric layer 696. The blocking dielectric can be formed by atomic layer deposition, chemical vapor deposition, or other processes FIG. 13E depicts the results of step 908 in one example, showing the formation of blocking dielectric 696. FIG. 13E shows a portion 1204 of stack 1200 containing just one of the memory holes from FIGS. 13A, 13B, 13C, and 13D. Blocking dielectric 696 is formed on the exposed sidewalls of the silicon nitride sacrificial layers and the silicon oxide insulating layers in the memory holes. Blocking dielectric 696 is also formed on the exposed surface of the monocrystalline silicon 614 at the bottom of the memory hole. The oxide provides a high wet etch selectivity for later removal of the sacrificial silicon nitride.

Figure 13F:
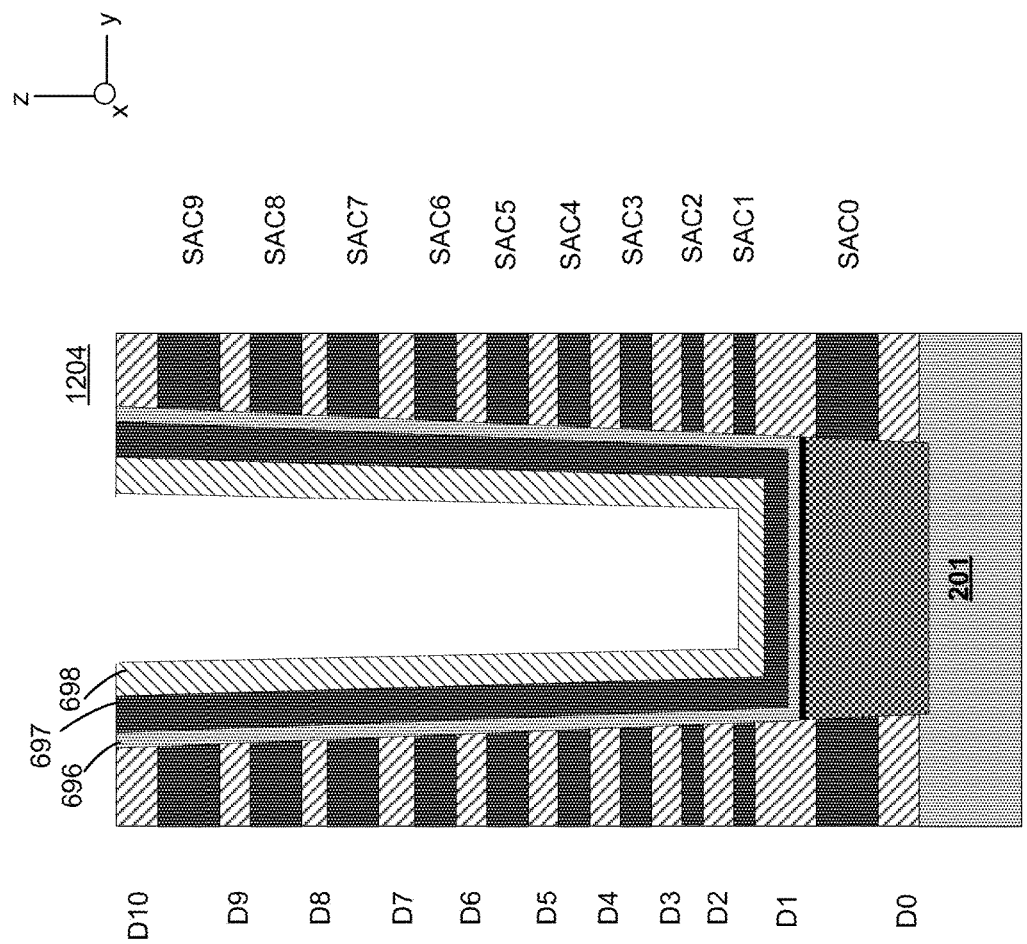

At step 910, one or more charge trapping layers (CTL) are formed in the memory holes. A single charge trapping layer is used in one embodiment, but multiple charge trapping layers may be used. These layers may be deposited as several conformal layers over vertical sidewalls of the memory holes, as well as over the silicon region 614. FIG. 13F depicts results after step 910.

In one example, three charge trapping layers can be used. A first charge trapping layer is deposited as a conformal layer over exposed vertical sidewalls of the memory holes, as well as over the oxide 696 on the bottom of the memory hole. A second charge trapping layer is deposited as a conformal layer over exposed vertical sidewalls of the first charge trapping layer, as well as over the first charge trapping layer at the bottom of the memory hole. A third charge trapping layer is deposited as a conformal layer over exposed vertical sidewalls of the second charge trapping layer, as well as over the second charge trapping layer at the bottom of the memory hole.

The first charge trapping layer, the second charge trapping layer, and the third charge trapping layer may be formed from materials including, but not limited to, those discussed in connection with FIG. 7A. By way of non-limiting example, the charge trapping layer may include one or more of Charge storage layer 708 may be, but is not limited to, $HfO_2$, $ZrO_2$, $Y_2O_3$, $La_2O_3$, $ZrSiO_4$, $BaZrO_2$, $BaTiO_3$, $T_2O_5$, $Zr_2SO_3$, $Si_3N_4$, $ZrSO_4$ The charge trapping layers could be deposited using ALD or CVD, for example. Table I lists a few combinations for the charge trapping layers.

TABLE I

| Third (Inner) | Second (Middle) | First (Outer) |
|---|---|---|
| $Si_3N_4$ | High-k | $Si_3N_4$ |
| $Si_3N_4$ | High-k | $La_2O_3$ |
| $La_2O_3$ | High-k | $Si_3N_4$ |
| $La_2O_3$ | High-k | $La_2O_3$ |
| $LaAlO_3$ | High-k | $La_2O_3$ |

In one embodiment, one or more of the charge trapping layers are implanted with metallic or other dopants (e.g., As, Ge, Zn). This may increase the ability of the charge trapping layer to store charge. The charge trapping layers could be amorphous, poly-crystalline, or mono-crystalline. Crystallizing a charge trapping layer may increase the k-value.

Example thicknesses of the charge trapping layers are 2 to 3 nm for the third charge trapping layer (closest to channel), 4 to 6 nm for the second charge trapping layer (middle), and 2 to 3 nm for the first charge trapping layer (furthest from the channel). As one specific example, 2 to 3 nm for silicon nitride in the first charge trapping layer, 4 to 6 nm for a high-k dielectric in the second charge trapping layer, and 2 to 3 nm for silicon nitride in the third charge trapping layer can be used. The thickness numbers above are provided for illustration only; the thicknesses of each of the layers may be smaller or bigger. Also, the combination of thicknesses can be different than these examples.

At step 912, one or more tunnel dielectric layers are formed in the memory holes. The tunnel dielectric 698 may be deposited as a conformal layer on the charge trapping region layer. Thus, the tunnel dielectric 698 may cover vertical sidewalls of the charge trapping layer 697, as well as the portion of the charge trapping region 697 that is on the silicon region 614.

Step 912 may include depositing multiple layers, such as $SiO_2$ and SiON, with the $SiO_2$ nearest the charge trapping region. The tunnel dielectric might also include $SiO_2$ and ISSG (in-situ steam generation) formed oxide, with the $SiO_2$ nearest the charge trapping region. The tunnel dielectric might include three layers: $SiO_2$, SiON, and ISSG formed oxide. However, any number of materials may be used including $Si_3N_4$ and SiN.

FIG. 13F depicts results after step 912 in one embodiment. Tunnel dielectric layer 698 is deposited as a conformal layer over exposed vertical sidewalls of the charge trapping layer 697, as well as over the charge trapping layer 697 on the bottom of the memory hole. Although not shown, a protective layer may be formed over the tunnel dielectric 698. For example, amorphous silicon oxide can be deposited as a conformal layer over exposed vertical sidewalls of tunnel dielectric layer 698, as well as over the tunnel dielectric layer 698 at the bottom of the memory hole.

At step 914, the bottom of the memory holes are etched to expose the silicon region 614. In one embodiment, this is a reactive ion etch (RIE). A post wet etch clean can be used as well to remove any protective layer that is applied. In one embodiment, a wet etch is used to remove the protective layer and polymer residues from the etch forming the memory holes.

Figure 13G:
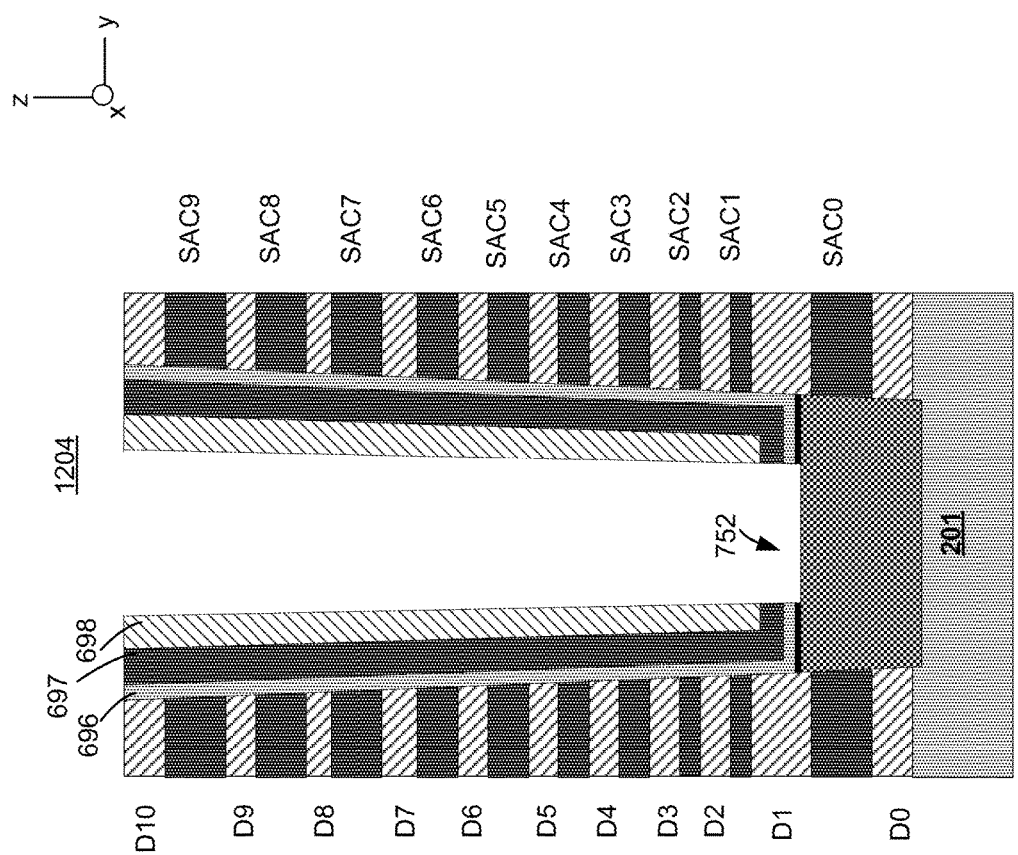

FIG. 13G shows results of step 914 in one embodiment. Etching creates an opening 752 at the bottom of the memory hole, exposing the surface of the silicon 614 that will be the body of the source side select transistor.

At step 916, the semiconductor channels are deposited in the memory holes. In one embodiment, amorphous silicon is deposited. This may be deposited as a conformal layer over the exposed sidewalls of the tunnel dielectric in the memory holes, as well as over the exposed silicon 614 at the bottom of the memory hole. The semiconductor channel could be formed from a semiconductor other than silicon.

Figure 13H:
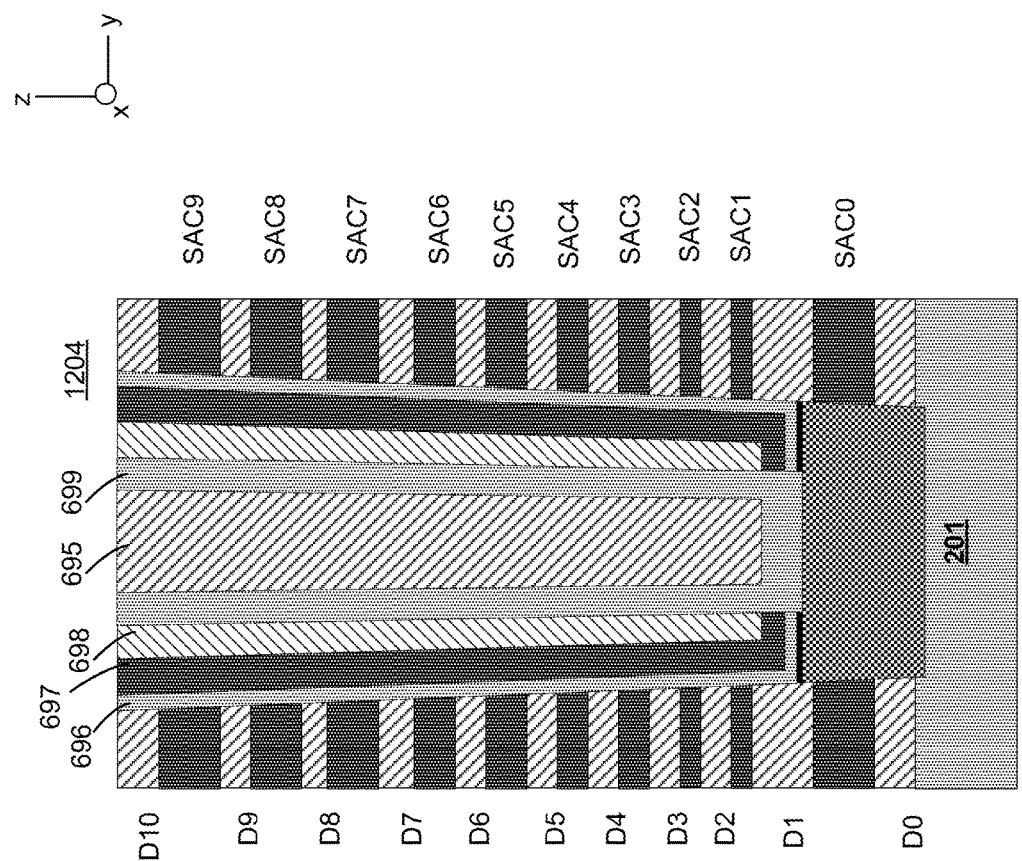

At step 918, a core of silicon oxide, for example, is formed in the memory holes. ALD is used in one embodiment. FIG. 13H shows the results of steps 916 and 918. The silicon channel 699 is shown as a conformal layer over sidewalls of tunnel layer 698, as well as over the top of the silicon 614 at the bottom of the memory hole. The $SiO_2$ core 695 is depicted is filling the remaining portion of the memory hole.

Figure 13I:
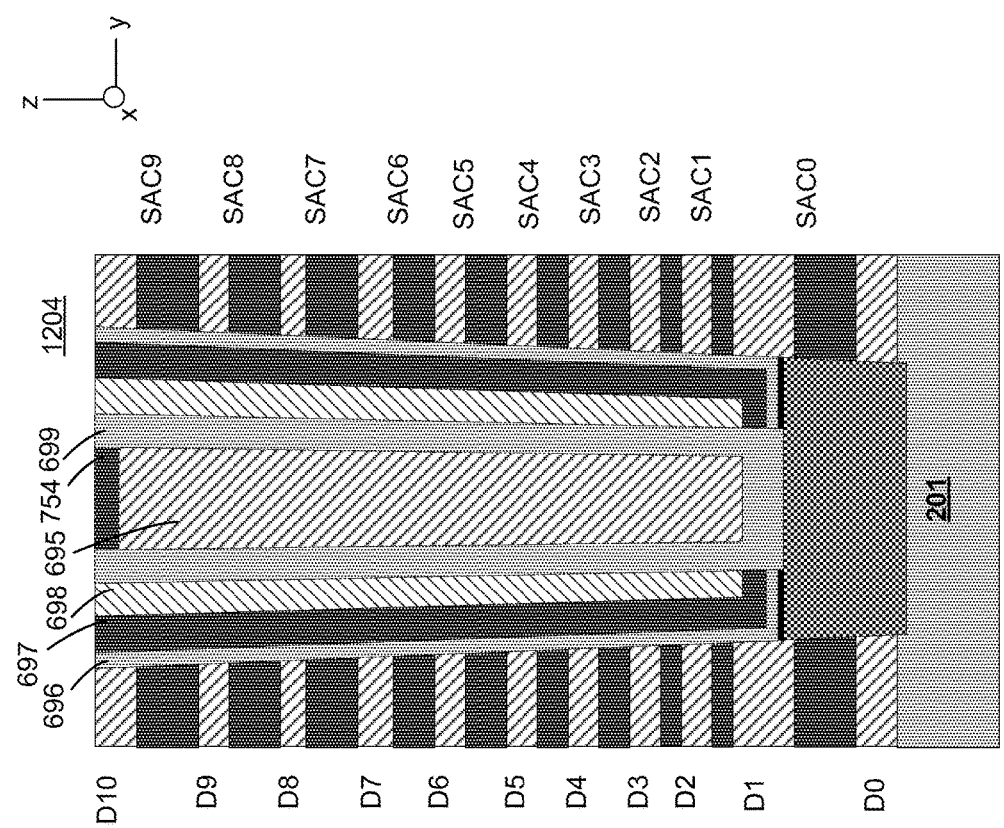

At step 920, a recess is formed in the $SiO_2$ core 695. This is a dry etch in one embodiment. At step 922, amorphous silicon is deposited in the recess in the $SiO_2$ core 695. The amorphous silicon may be deposited by CVD. At step 924, an impurity is implanted into the amorphous silicon. The doping may be in situ. The impurity could be arsenic, phosphorous, boron, or a combination thereof, but is not limited thereto. At step 924, an activation anneal is performed. This reduces the contact resistance. FIG. 13I depicts the results of steps 920-924 in one example, showing a silicon cap 754 at the top of the $SiO_2$ core 695.

At step 926, slits are etched in the alternating silicon oxide ($SiO_2$)/silicon nitride (SiN) layers. In another example, slits may be etched earlier in the process and filled with an insulator. In such a case, step 928 can include etching to remove the insulator instead of etching the alternating SiO2 and SiN layers directly. FIGS. 4B and 4C show examples of slits 502 for straight NAND strings. FIG. 3B shows one example of slits 408 for U-shaped NAND strings. The pattern in which the slits are formed can vary widely. In one embodiment, the slits are a light trench formation process used to form source side contacts to the memory hole.

At step 928, an etch is performed via the slits to remove portions of the silicon nitride layers. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings. Note that the blocking dielectric 696 may serve as an etch stop.

FIG. 13J depicts the results of step 928 in one example. The wet etch should remove essentially the entire silicon nitride layers wherein the NAND strings are being formed (memory cell area), so that when the regions of the removed silicon nitride are replaced by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

Note that rather than performing the etch through the slits to remove the sacrificial material, the sacrificial material could be removed by etching through holes, voids, etc. In another embodiment, the sacrificial material is removed at an earlier stage of the process by etching through the memory holes to remove the sacrificial material. In such an embodiment, the slits can be filled with a material that serves as an anchor when etching through the memory holes.

At step 932, a gate oxide for the source side select gate (SSG) is formed. Step 932 may include water vapor generator (WVG) oxidation of exposed silicon 614 at the bottom of the memory holes. This step serves to form the gate oxide of the source side select transistors. The WVG oxidation selectively oxidizes silicon. Also, the surface of the substrate may also be oxidized.

Figure 13K:
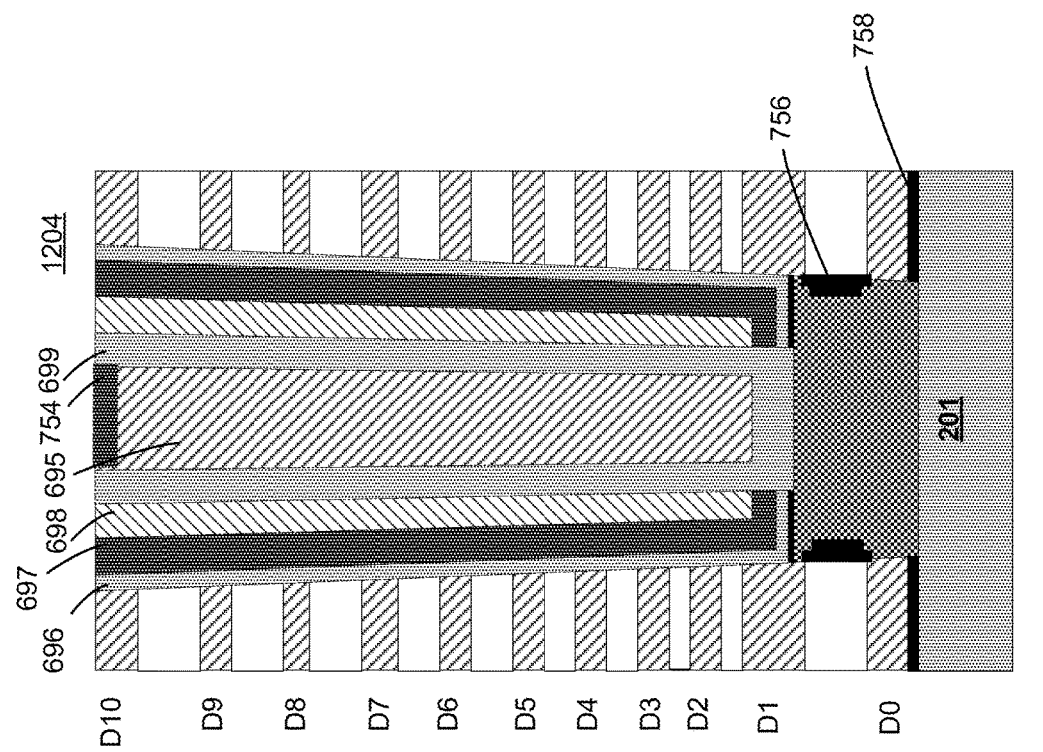

FIG. 13K shows results after step 932 in one example. The gate oxide 1216a for the source side select transistor is shown on vertical sidewalls of silicon 614. Also, oxide 1216b is shown on the surface of the substrate 201. Note that the substrate 201 is a p-substrate, at least near the oxide 1216b, in one embodiment.

At step, 934 a conductive material (one or more layers) such as metal is formed in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal. In one embodiment, first a tungsten nucleation layer is formed, then tungsten is deposited by CVD.

At step 936, the slits are re-filled. A tungsten recess may be performed to isolate the word lines. Also a cover dTEOS may be deposited by CVD.

Figure 13L:
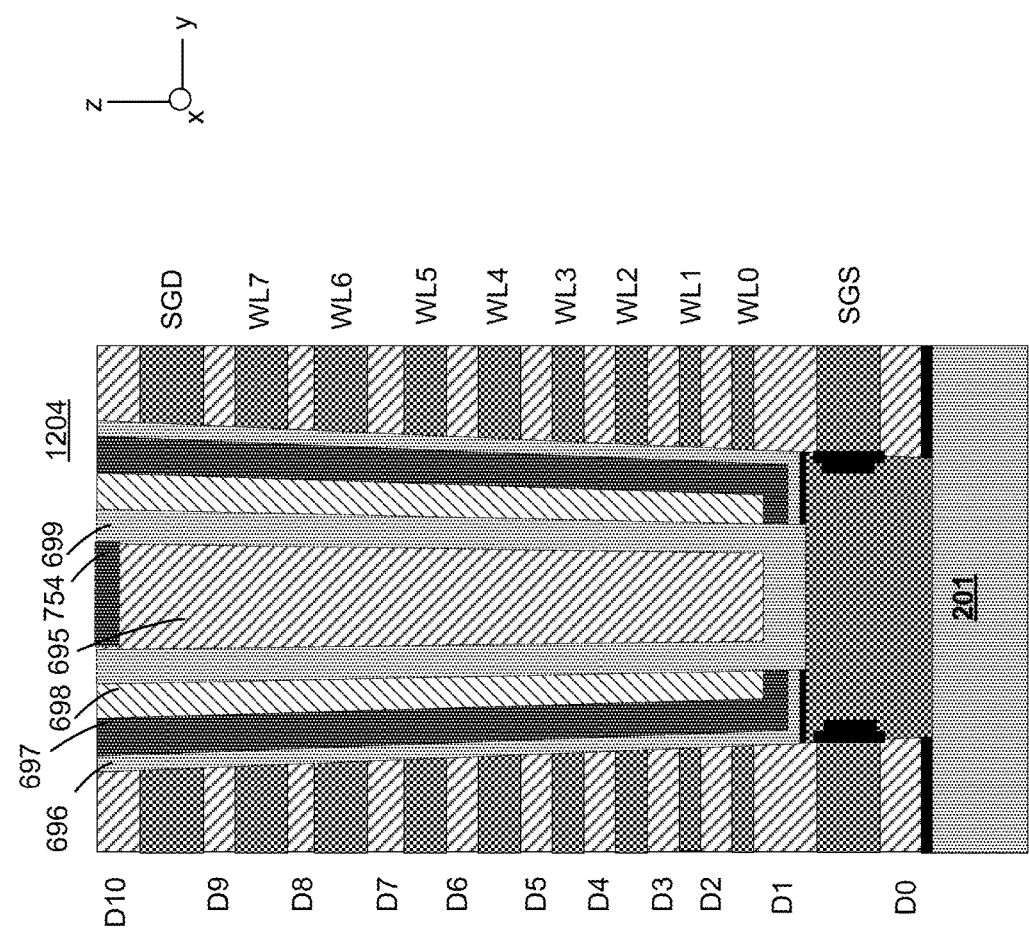

FIG. 13L shows the results of steps 934 and 936 in one example. The sacrificial layers SAC0-SAC7 have been replaced by metal layers SGS, WL0-WL7, and SGD, respectively. Although not shown, an aluminum oxide blocking layer can be formed, followed by a titanium nitride barrier layer in the holes where the sacrificial material was removed prior to forming the conductive material for the word lines.

The programming speed of a memory device may also be controlled by varying the horizontal thickness (y-direction) of the blocking dielectric formed between the word lines and the charge trapping material.

Figure 14:
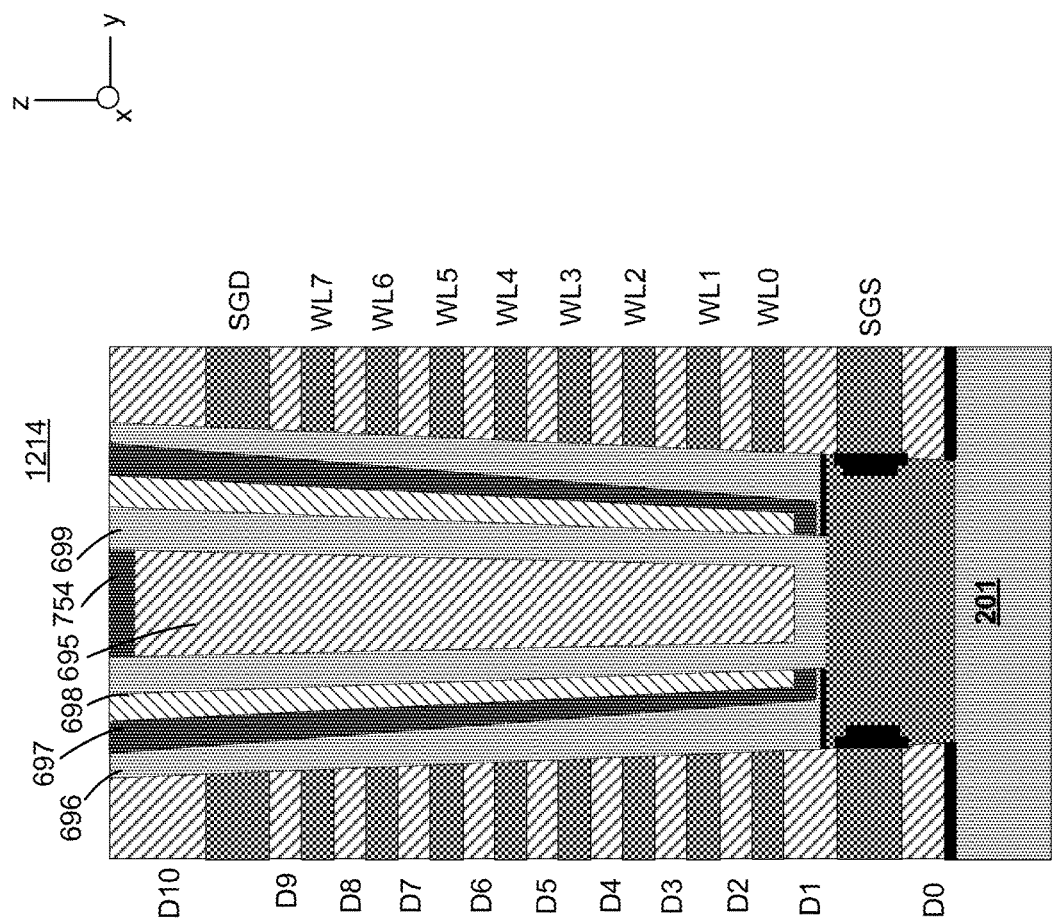
FIG. 14 is a cross-sectional view of a portion of a 3D stacked memory array including a memory hole having a blocking dielectric with a thickness that varies with a vertical distance from a substrate surface in one embodiment.

FIG. 14 is a cross-sectional view of a portion 1214 of a stacked three-dimensional memory array in accordance with one embodiment. The thickness of the blocking dielectric is varied based on the diameter of the memory hole adjacent to the blocking dielectric and corresponding word line. The blocking dielectric 696 has a smaller thickness at the top of the memory hole and a larger thickness at the bottom of the memory hole closest to the substrate. In this example, the blocking dielectric includes a gradual taper from bottom of the hole to the top of the hole resulting in horizontal thickness that progressively decreases as the diameter of the memory hole increases. In one embodiment, the blocking dielectric has a thickness of 5 nm at the top, 6 nm in the middle, and 7 nm at the bottom. Various dimensions and variations in thickness may be used. It is expected in some implementations that a difference in 1 nm of blocking oxide thickness may result in a 0.4V difference in programming speed.

By way of example, FIG. 14 illustrates a first word line layer (e.g., WL1) that is formed below a second word line layer (e.g., WL2). A blocking dielectric is formed in the memory hole with a first thickness adjacent to the first word line WL1 and a second thickness adjacent to the second word line. The second thickness is less than the first thickness. The blocking dielectric can be tapered with a thickness that is progressively smaller from a region adjacent to the top word line layer to a region adjacent to the bottom word line layer. The blocking dielectric thickness can vary continuously from the region adjacent to the top word line layer to the region adjacent to the bottom word line layer.

Figure 15:
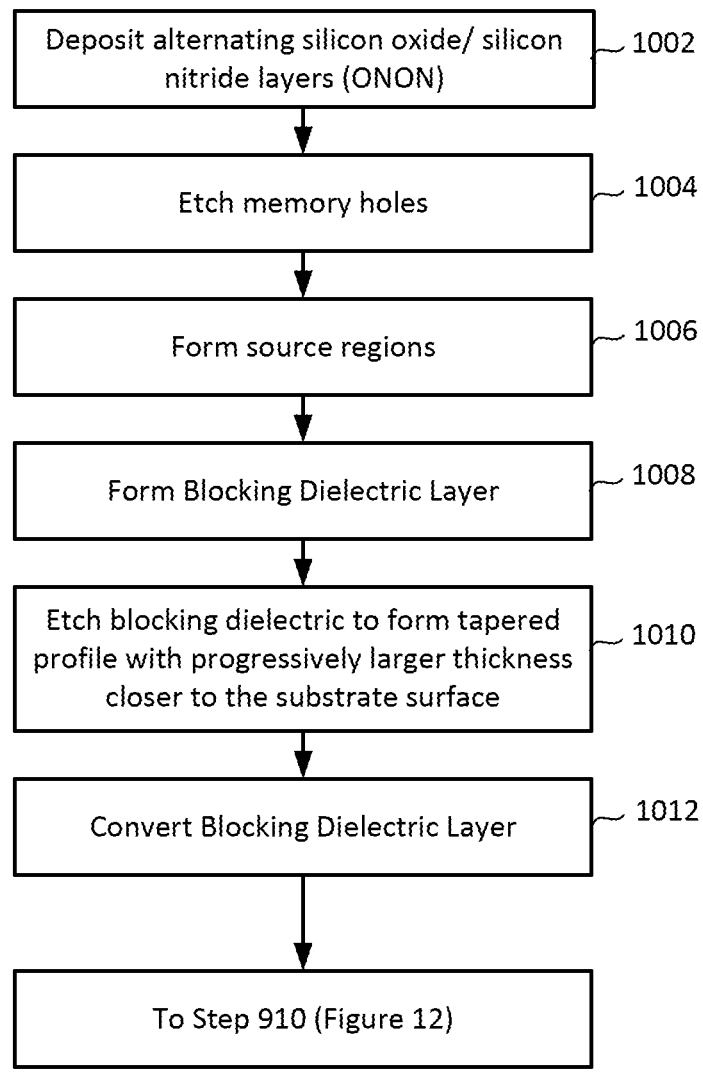
FIG. 15 is a flowchart describing a process of fabricating a memory device with a variable thickness blocking dielectric in one embodiment.

FIG. 15 is a flowchart of one embodiment of a process of fabricating a memory device having a variable blocking dielectric thickness based on a corresponding memory hole diameter. The process may be used to fabricate a 3D memory array (such as 3D NAND) including straight and U-shaped NAND strings. The steps may be performed in a different order than presented in the flowchart. FIGS. 16A-16F depict the results of various process steps outlined in FIG. 15. Various modifications can be made. Moreover, other steps which are known from the art of semiconductor fabrication but are not explicitly depicted here may also be performed.

At step 1002, alternating silicon oxide ($SiO_2$)/silicon nitride (SiN) layers are deposited above the substrate 201. The alternating sacrificial and dielectric layers can be formed as earlier described. In one embodiment, the sacrificial layers for the word lines have varying thicknesses as earlier described to form word lines with different gate lengths. In another embodiment, the sacrificial layers have the same thickness.

At step 1004, memory holes (MH) are etched in the stack of alternating layers as earlier described. Etching the memory holes creates a tapered profile for the memory holes such that the diameter is progressively smaller toward the bottom of the memory hole. At step 1006, source regions are formed in the memory holes.

Figure 16A:
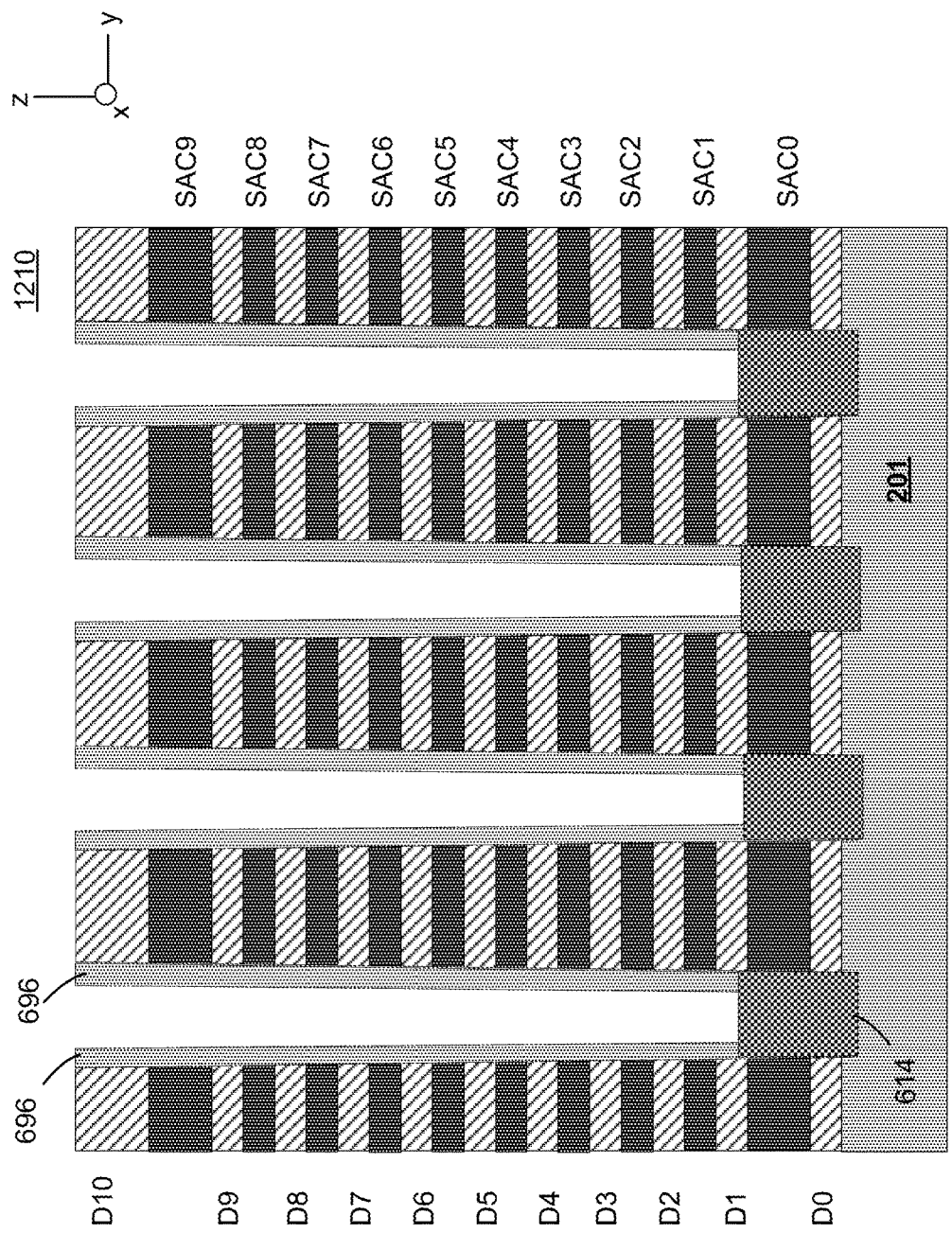
Figure 16B:
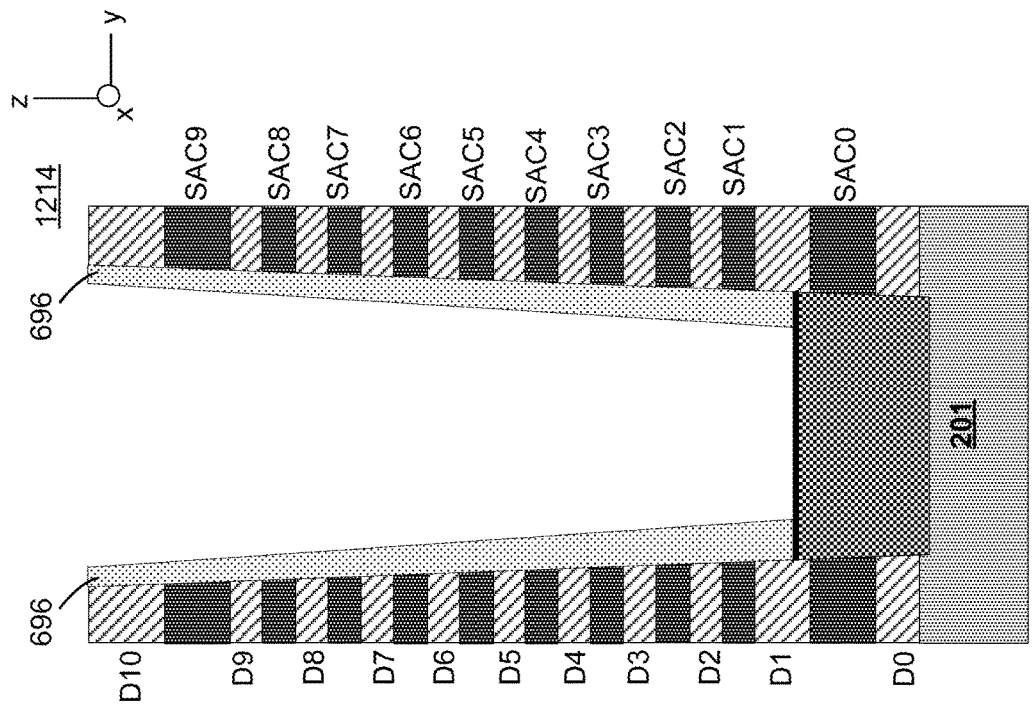

At step 1008, the blocking dielectric layer is formed. FIG. 16A shows the results of step 1008 in one embodiment including a stack 1210. Blocking dielectric 696 is formed along the vertical sidewalls of the memory hole. ALD or CVD processes can be used to form a conformal layer of SiN which is later converted to an oxide such as SiO2. Other suitable insulating materials can be used. FIG. 16B is a cross-sectional view of a portion 1214 of a stack including a single memory hole showing more detail of the blocking dielectric 696 and memory hole structure. As FIG. 16B illustrates, blocking dielectric 696 is initially formed with a substantially uniform horizontal thickness (y-direction) in this example.

Figure 16C:
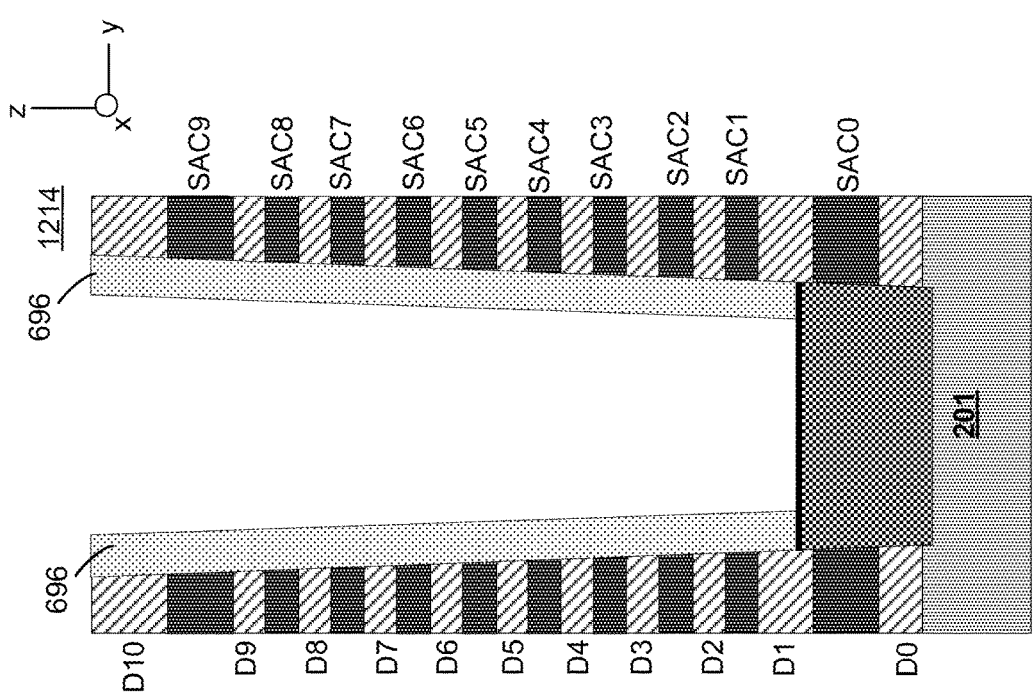

At step 1010, the blocking dielectric layer is etched to create a tapered profile with a larger thickness at the bottom of the memory hole and a smaller thickness at the top of the memory hole. Reactive ion etching is used in one example. FIG. 16C depicts the results of step 1010 in one embodiment. The blocking dielectric has a tapered profile from top to bottom, with a thickness that gradually and progressively increases as the memory hole decreases in diameter closer the substrate surface. For example, the thickness of the blocking dielectric at a position adjacent to sacrificial layer SAC7 for word line WL7 is larger than the thickness of the blocking dielectric at a position adjacent to sacrificial layer SAC1. In this example, the blocking dielectric gradually increases in thickness such that the thickness adjacent to each word line is different.

At step 1012, the blocking dielectric layer is converted from silicon nitride SiN to SiO2 or another suitable blocking dielectric material. Step 1012 is optional. In one example, the blocking dielectric layer is initially formed as the final material that will be used.

After converting the blocking dielectric layer at step 1012, the process proceeds as earlier described with respect to FIG. 12, beginning with step 910.

Figure 17:
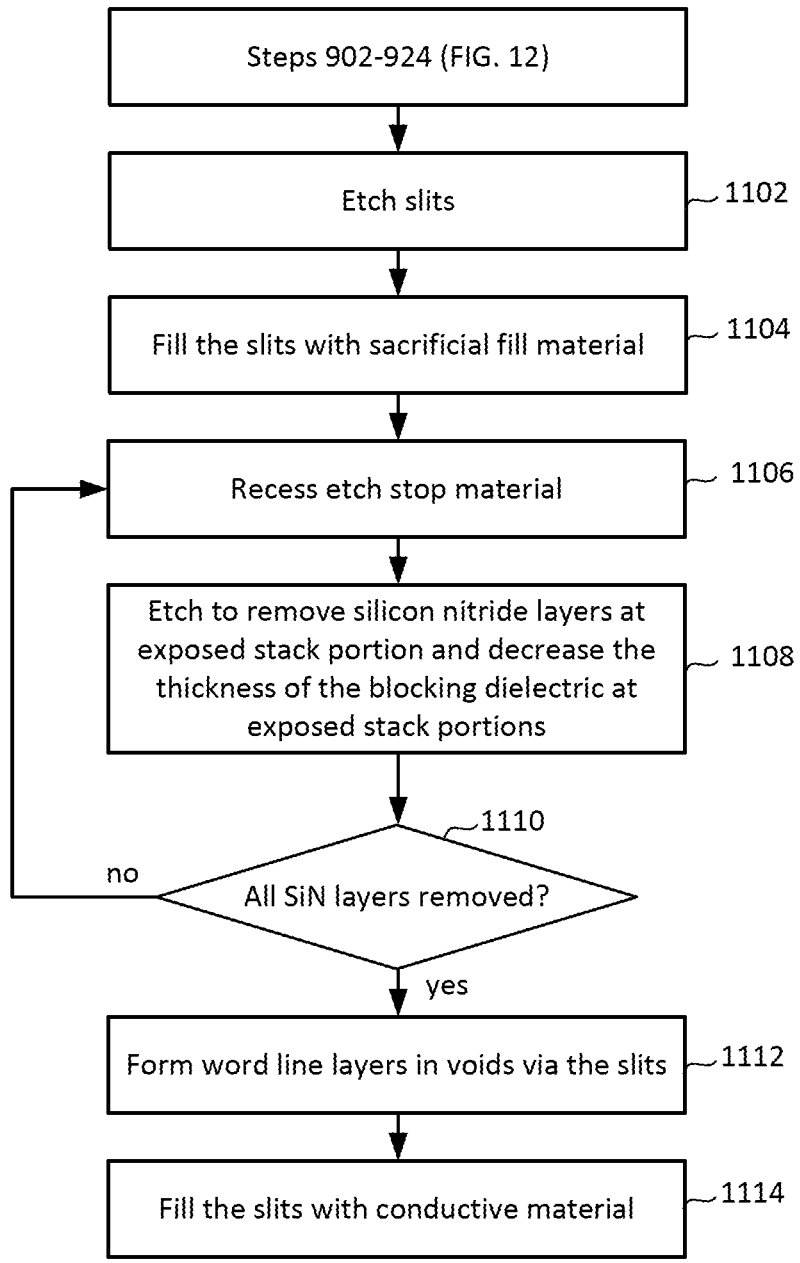
FIG. 17 is a flowchart describing a process of fabricating a memory device with a variable thickness blocking dielectric in one embodiment.

FIG. 17 is a flowchart of another embodiment of a process of fabricating a memory device having a variable blocking dielectric thickness based on a corresponding memory hole diameter. The process may be used to fabricate a 3D memory array (such as 3D NAND) including straight and U-shaped NAND strings. FIGS. 18A-18J depict the results of various process steps outlined in FIG. 17.

The fabrication process initially proceeds as outlined in steps 902-926 of FIG. 12. The sacrificial layers that are later removed to eventually form the word lines may be formed with variable thicknesses as described in FIG. 12, or may be formed with the same thickness.

Figure 18A:
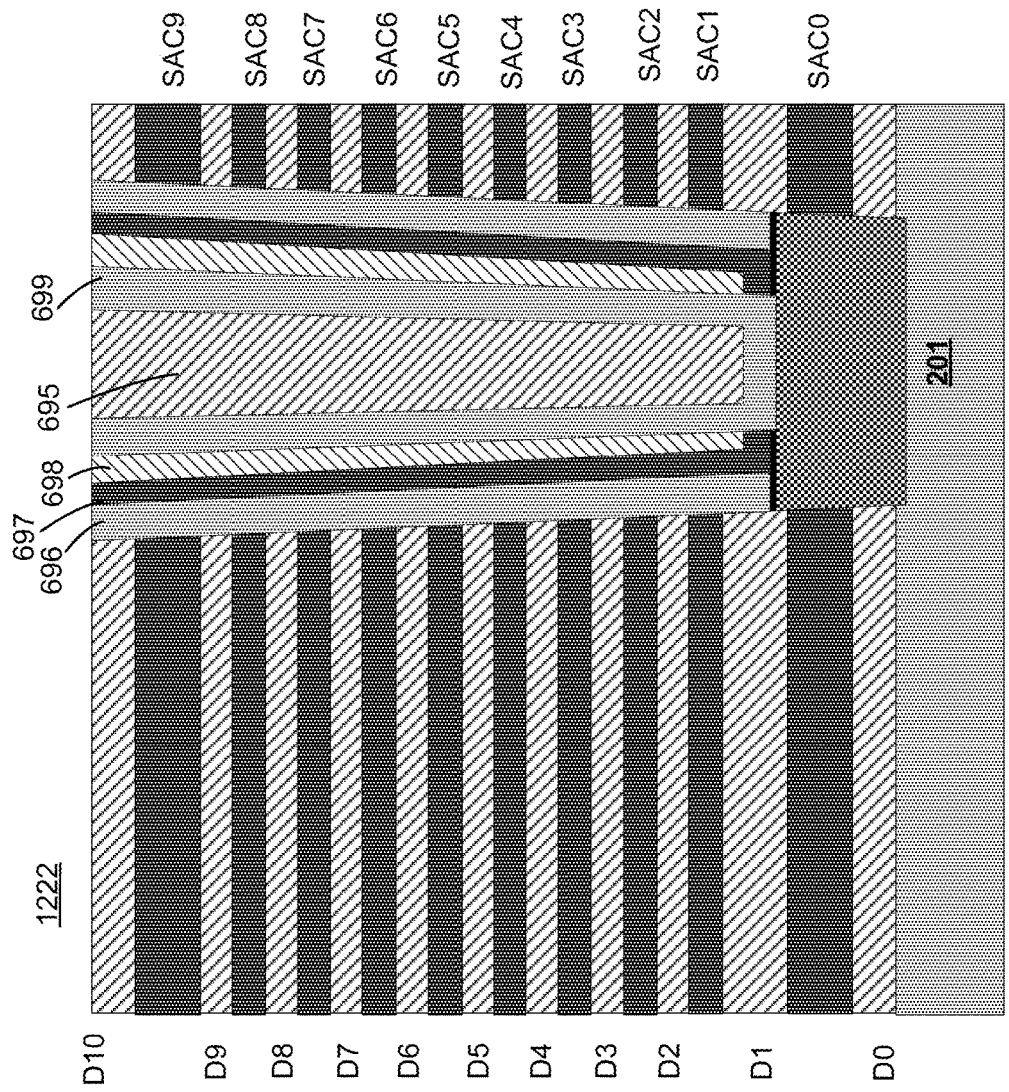
FIGS. 18A-18J are cross-sectional views depicting the results of the process of FIG. 18 in one embodiment.

FIG. 18A is a cross-sectional view depicting the results of steps 902-924 in one example. A portion of a stack 1222 is shown. A memory hole has been etched in the alternating conductive word line layers and dielectric layers. The memory hole has been filled with a blocking dielectric 696, a charge trapping layer 697, a tunnel dielectric layer 698, a semiconductor channel 699, and a core 695. As FIG. 18A illustrates, the blocking dielectric 696 is initially formed with a uniform horizontal thickness. Moreover, the thickness is uniform even after forming the additional memory hole layers, in contrast to the embodiment shown in FIG. 16E. In the process of FIG. 17, an additional etch step for the blocking dielectric layer prior to forming the charge trap layer is not performed. It is noted that the blocking dielectric may be formed of an initial material and then converted to SiO2, for example, as described in FIG. 15.

Figure 18B:
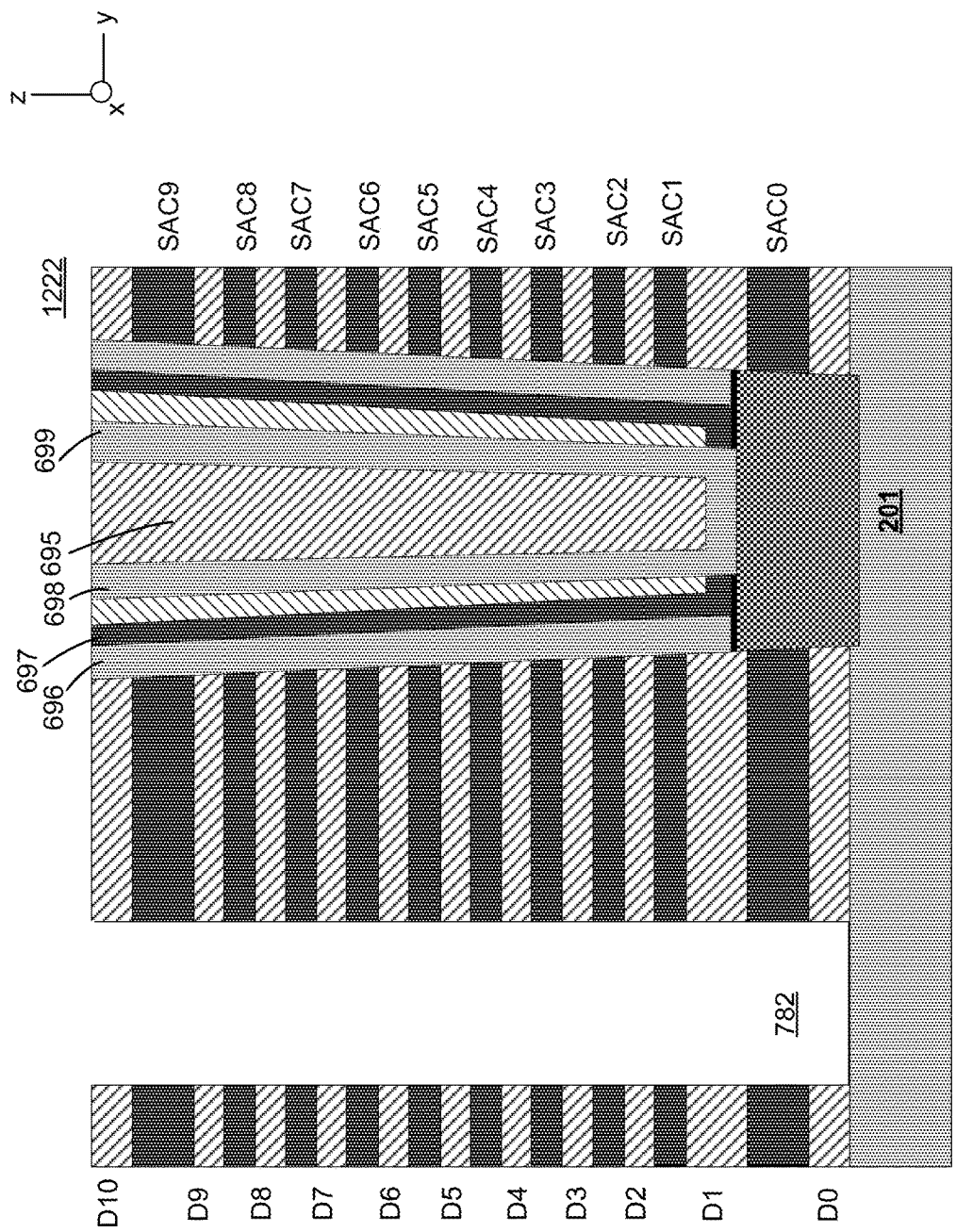

At step 1102, slits are etched into the alternating word line and insulating layers. The slits may be etched using traditional lithographical processes for example. The slits are etched between adjacent memory holes as shown in FIGS. 3B and 4B. The slits can be formed using light trench techniques in one embodiment. FIG. 18B depicts the results of step 1102 in one example. A slit 782, also referred to as a light trench, is formed in the stack adjacent to the memory hole. Reactive ion etching or other processes may be used.

Figure 18C:
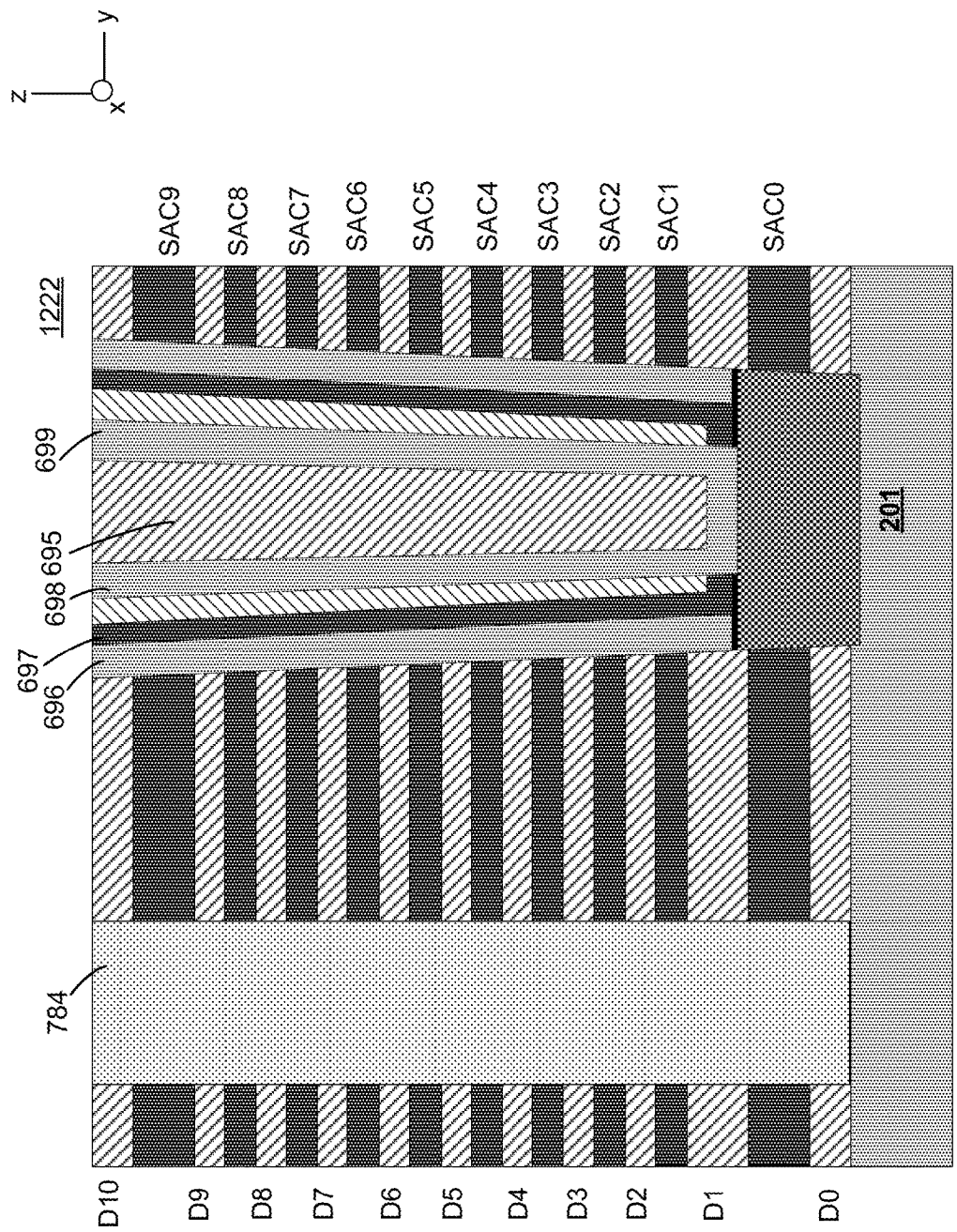

At step 1104, the slits are filled with a sacrificial material that can serve as an etch stop when etching the sacrificial nitride layers. In one embodiment, the sacrificial material is polysilicon, but other materials can be used. FIG. 18C depicts the results of step 1104 in one example. Slit 782 has been filled with sacrificial material forming an etch stop layer 784 The sacrificial material completely fills the slit. In one embodiment, CMP or an etch back can be used to remove any material that overfills the slit. Filling the trench will etch stop material may be contrasted with the technique shown in FIG. 13J where the sacrificial SiN material is removed immediately after forming the slits.

At step 1106, the etch stop material 784 is recessed by a predetermined amount. Reactive ion etching or other processes may be used to selective etch the sacrificial material relative to the nitride and oxide layers. The sacrificial material is recessed less than the full depth of the memory hole. The etch stop material is recessed to expose a subset of the sacrificial layers that will later be removed to form the word lines.

Figure 18D:
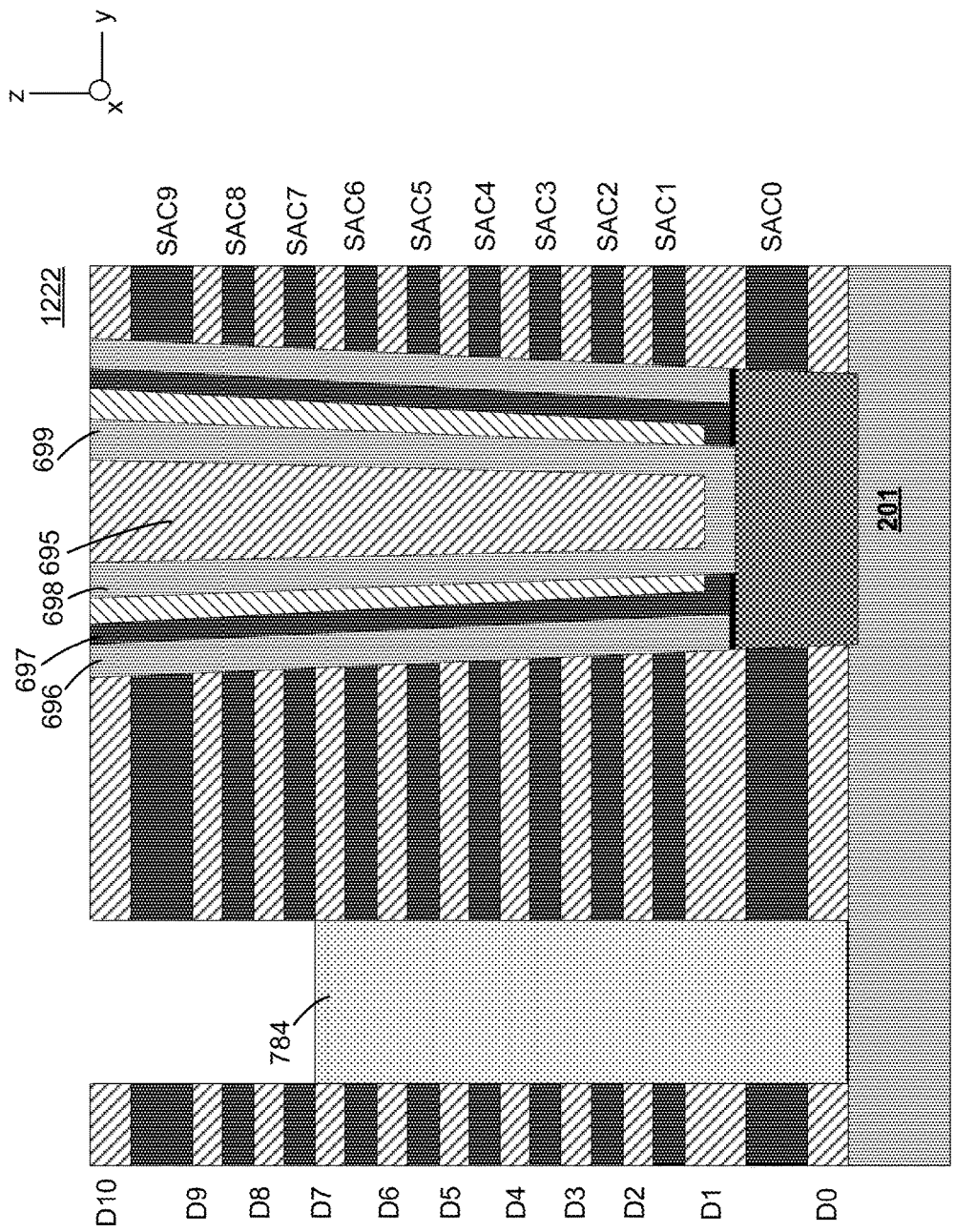

FIG. 18D depicts the results of step 1106 in one embodiment. In this example, the initial recess at step 1106 etches sacrificial material 762 below the level of the lower surface of sacrificial layer SAC7. Recessing the sacrificial material 762 exposes layers SAC9, SAC8, and SAC7, while the underlying sacrificial layers remain protected by the etch stop fill 756. The amount of recess depicted in FIG. 18D is exemplary only, as the initial recess may expose fewer than two sacrificial word line layers or more than two layers. The etch can have a relatively higher selectivity for the polysilicon etch stop material than for the silicon oxide and nitride layers.

At step 1108, etching is performed in the memory hole that is selective for the material for the sacrificial word line layers. Etching at step 1108 removes any exposed nitride in one embodiment, removing the sacrificial word line layers that are exposed by etching back the etch stop fill material. Etching at step 1108 also removes a portion of the blocking dielectric that was adjacent to the now removed sacrificial layers.

Figure 18E:
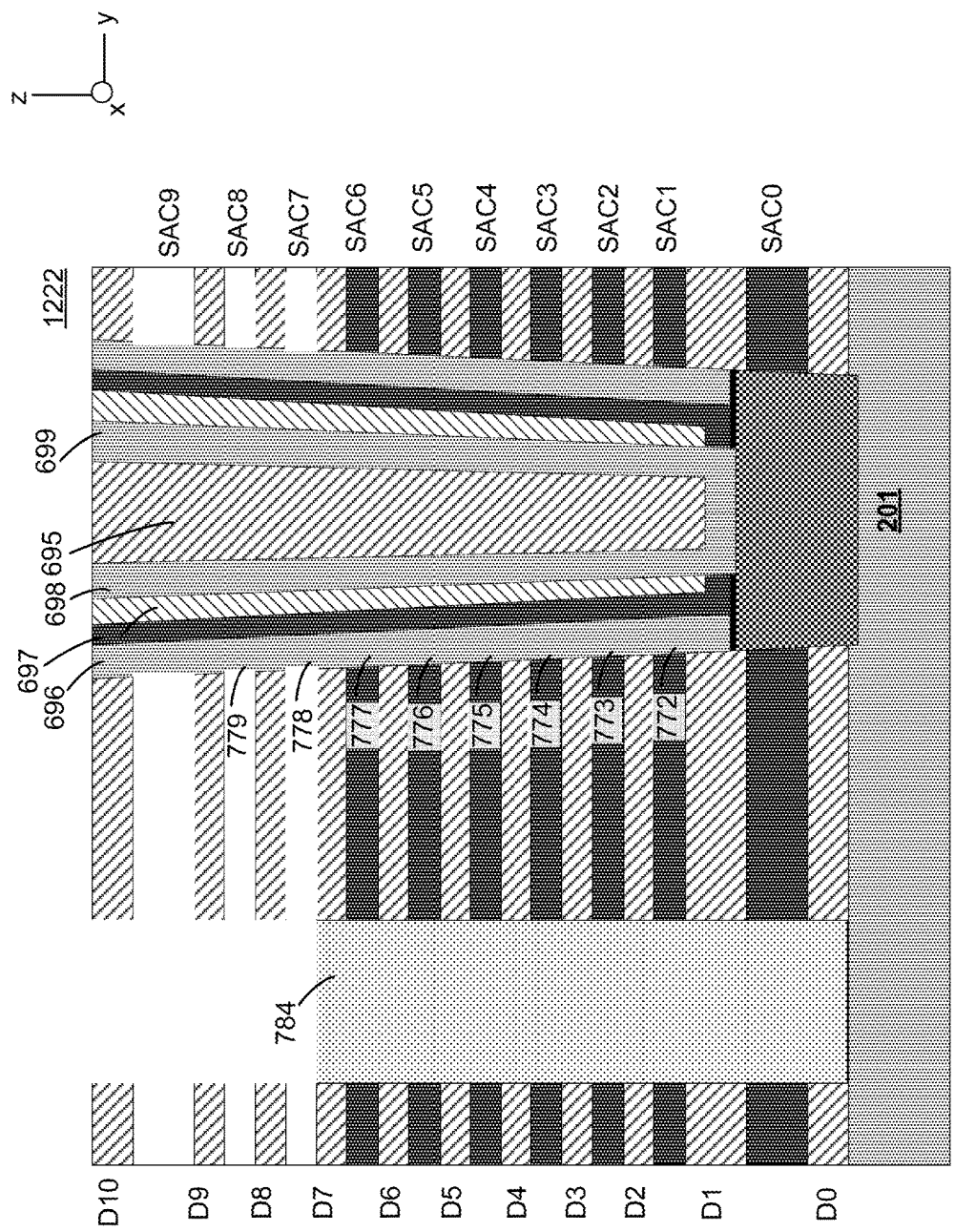

FIG. 18E depicts the results of step 1108 in one embodiment. Sacrificial layers SAC9, SAC8, and SAC7 have been removed, forming voids in which to form word lines. An etch is performed via the slits to remove portions of the silicon nitride layers. The etch can involve introducing an etchant via the slits, which has a higher selectivity for the silicon nitride, removing the silicon nitride layers. Note that the blocking dielectric 696 may serve as an etch stop. The wet etch should remove essentially the entire silicon nitride layers where NAND strings are being formed.

Additionally, etching may be performed that removes a portion of the blocking dielectric layer 696 at regions adjacent to the voids. In FIG. 18E, the blocking dielectric layer is partially removed at regions 779 and 778. As a result of the initial etch process at step 1108, the blocking dielectric has a thickness at upper regions 778 and 779 that is smaller than a thickness at regions 772-777. In one embodiment, the etch that is selective for the silicon nitride is used to slightly etch the oxide. In another embodiment, a second etch can be performed, using different etchants for example, to etch the blocking dielectric at regions 779 and 778.

At step 1110, the process branches based on whether all of the sacrificial layers have been removed. If all of the sacrificial layers have not been removed, the process returns to step 1106 to again recess the sacrificial material by a predetermined amount. The predetermined amount may vary during different iterations of step 1106 or may be the same.

Figure 18F:
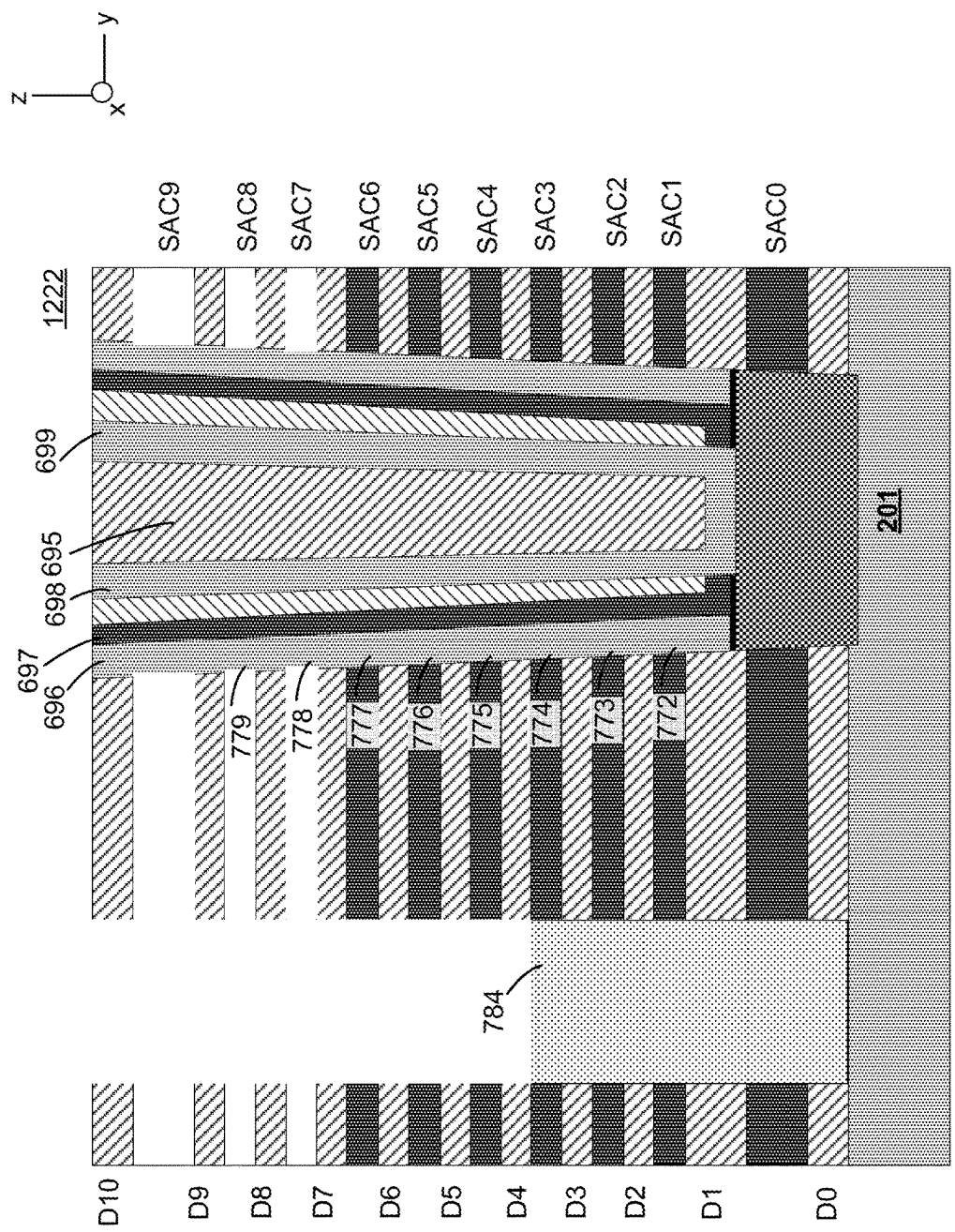
Figure 18G:
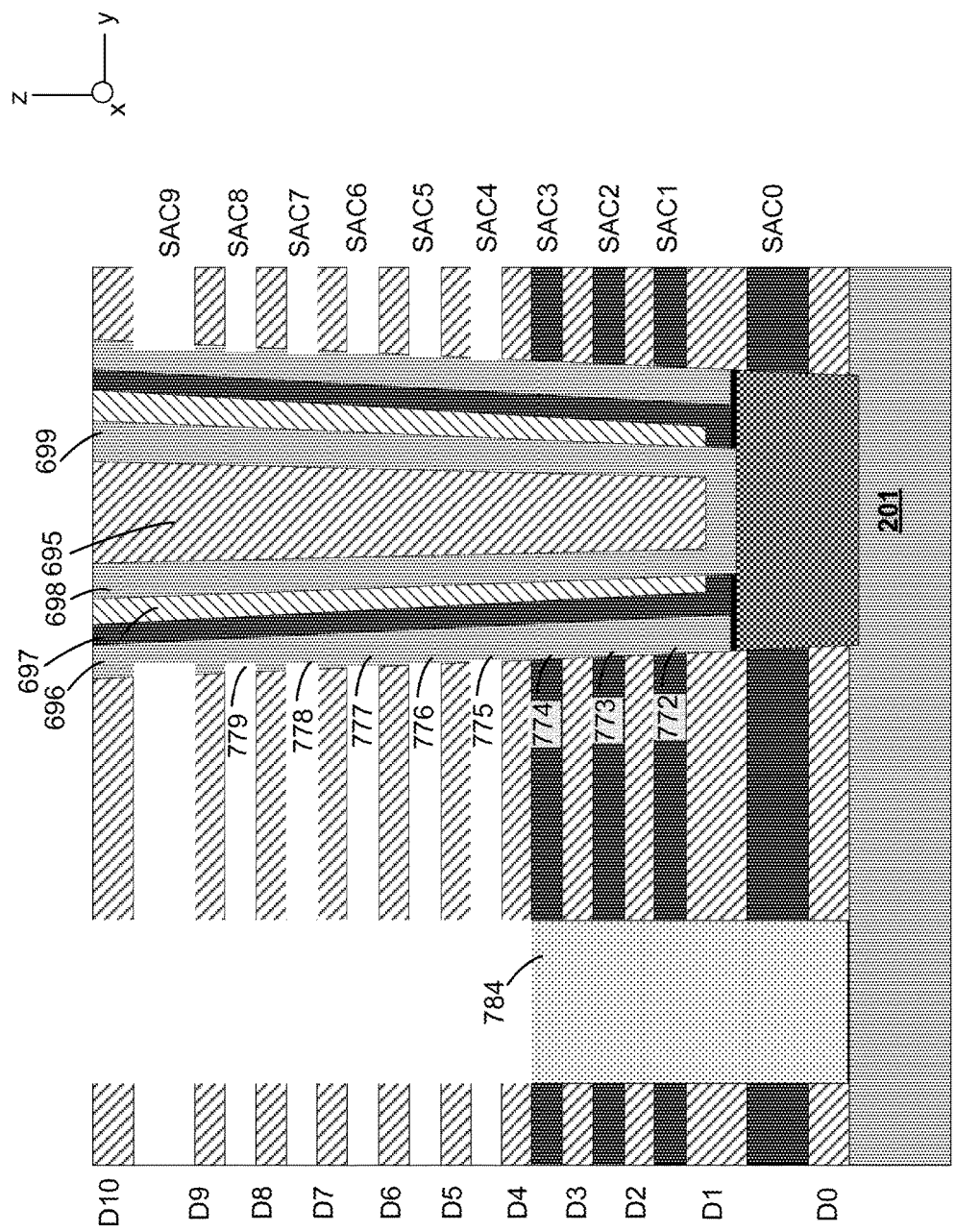

FIG. 18F depicts the results of a second iteration of step 1106 in one example. In this case, the etch stop material is recessed to expose sacrificial layers SAC6, SAC5, and SAC4 during the second iteration of step 1106. At step 1108, etching is again performed to remove the sacrificial layers SAC6, SAC5, and SAC4. FIG. 18G depicts the results of a second iteration of step 1108 in one example. In this case, etching removes SAC6, SAC5, and SAC4 from the targeted word line areas. Etching also removes a portion of the blocking dielectric at regions 775, 776, and 777 adjacent to the voids formed by removing SAC6, SAC5, and SAC4.

Additionally, blocking dielectric 696 at regions 778 and 779 is again exposed during the second etch process. This removes additional portions of the blocking dielectric 696 at these regions as shown in FIG. 18F. As a result of the second etch process at step 1108, the blocking dielectric has a thickness at middle regions 775, 776, and 777 which is smaller than the thickness at regions 772-774. Additionally, the blocking dielectric has a thickness at upper regions 778 and 779 that is smaller than the thickness at regions 772-777.

Figure 18H:
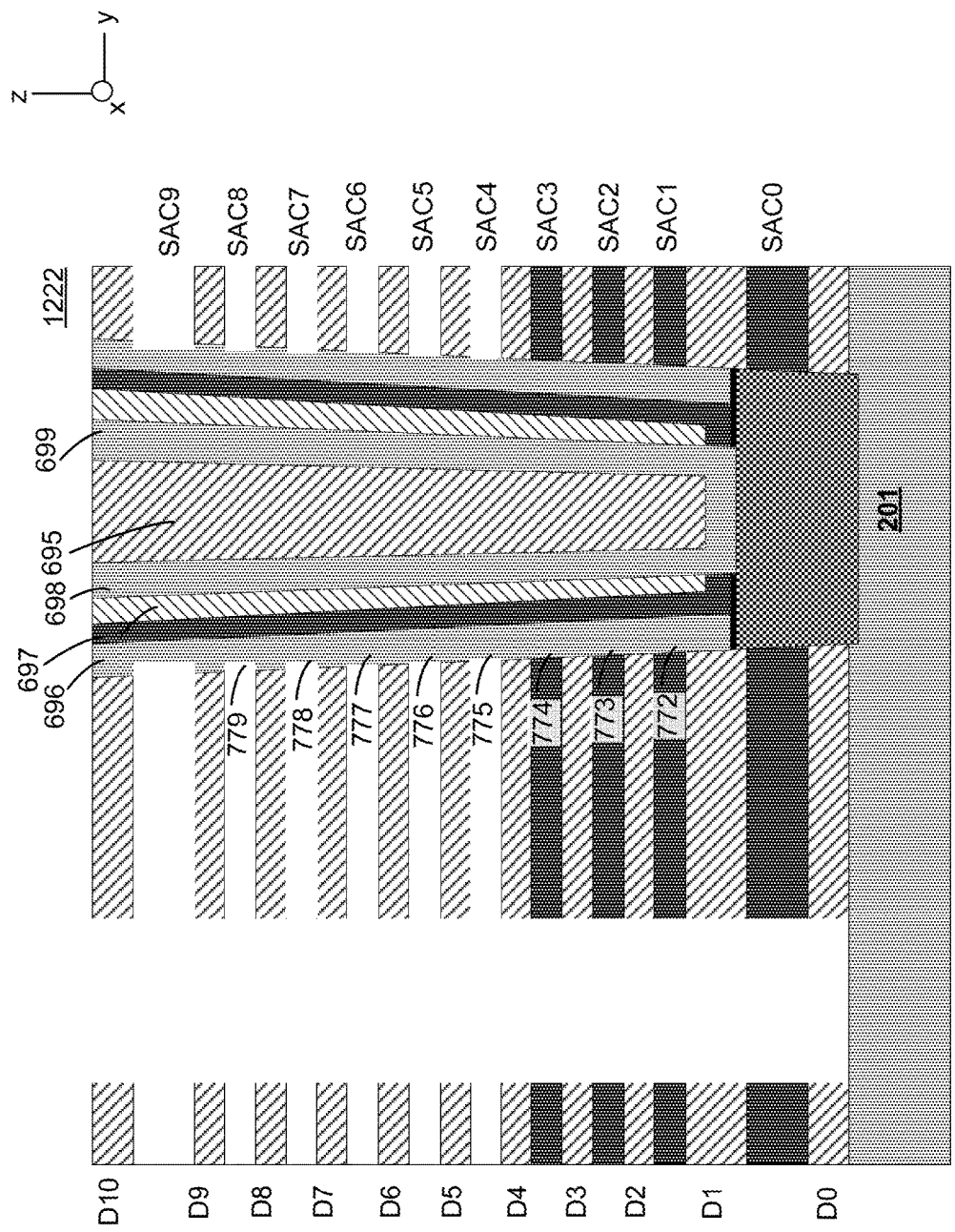
Figure 18I:
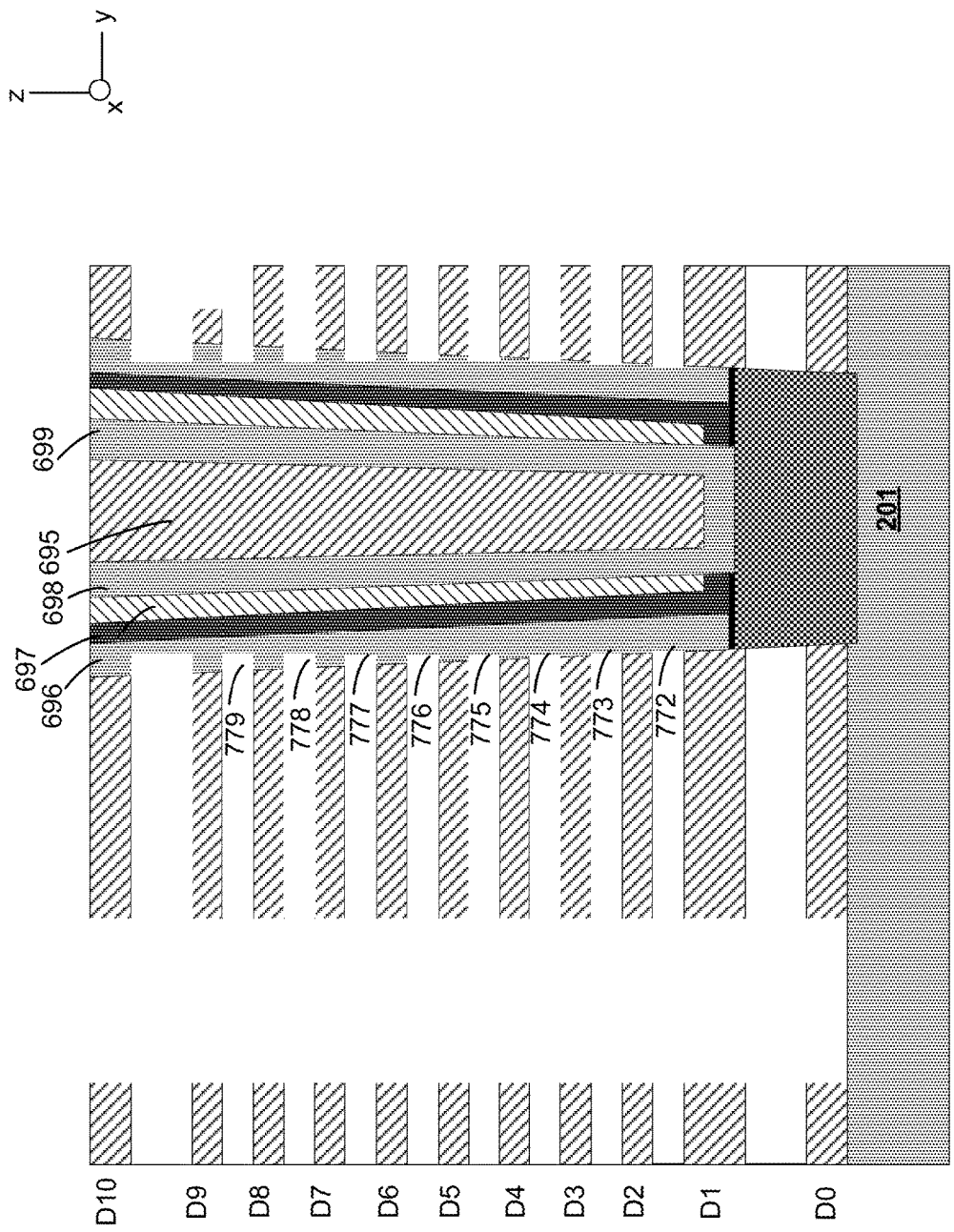
Figure 18J:
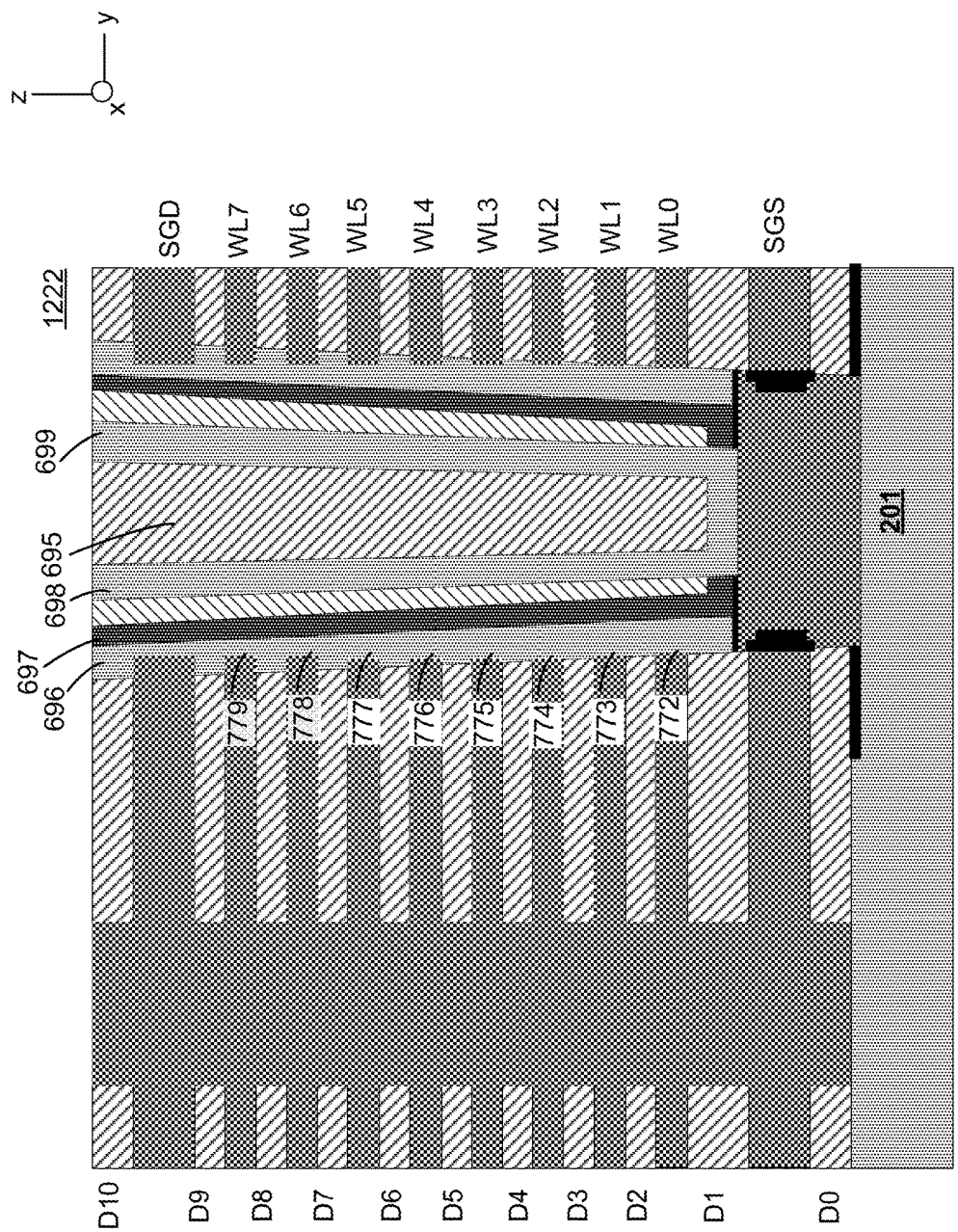
Figure 19:
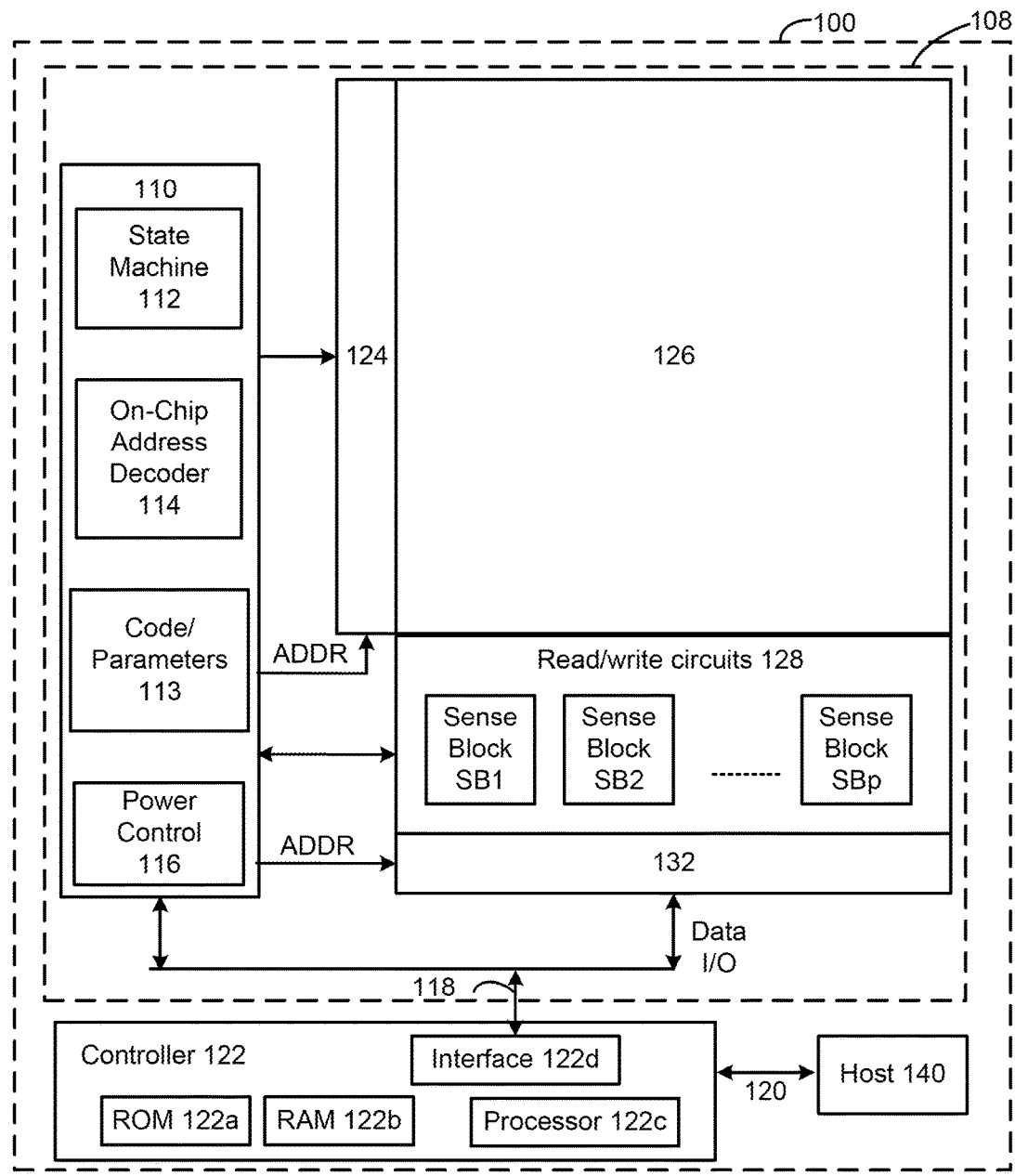
FIG. 19 is a functional block diagram of a memory device such as the 3D stacked non-volatile memory device 100 of FIG. 2.

FIG. 18H depicts the results of a third iteration of step 1106 in one example. In this case, the etch stop material is completely removed in the third iteration. Sacrificial layers SAC0, SAC1, SAC2, and SAC3 are exposed during the second iteration of step 1106. At step 1108, etching is performed to remove SAC0, SAC1, SAC2, and SAC3. FIG. 18I depicts the results of the third iteration after removing SAC0, SAC1, SAC2, and SAC3 from the targeted word line areas. Etching also removes a portion of the blocking dielectric at regions 772, 773, and 774 adjacent to the voids formed by removing SAC1, SAC2, and SAC3.

Additionally, blocking dielectric 696 at regions 775-779 is again exposed during the third etch process. This removes additional portions of the blocking dielectric 696 at these regions as shown in FIG. 18I. As a result of the third etch process at step 1108, the blocking dielectric has a thickness at middle regions 775, 776, and 777 which is smaller than the thickness at regions 772-774. Additionally, the blocking dielectric has a thickness at upper regions 778 and 779 that is smaller than a the thickness at regions 772-777.

Accordingly, the thickness of the blocking dielectric is again made to decrease from a top of the memory hole to a bottom of the memory hole. The decreased blocking dielectric thickness at the top slows the programming speed when compared with the programming speed at the bottom where the blocking dielectric is thicker. Because the narrower memory hole at the bottom may increase the programming speed, the thicker blocking dielectric may counteract the increased programming speed. This technique applied across the memory hole height may provide a more consistent programming speed across all word lines.

In one example as shown, the blocking dielectric has different thicknesses for different regions such that it does not continuously vary. For example, the blocking dielectric can include a first region adjacent to a first set of word lines of the plurality. The blocking dielectric may include at least the first thickness at the first region. The blocking dielectric may include a second region adjacent to a second set of word lines of the plurality. The blocking dielectric may have at least a second thickness at the second region. The second set of word lines is formed above the first set of word lines and the second thickness is less than the first thickness. The blocking dielectric includes a third region adjacent to a third set of word lines of the plurality, the blocking dielectric having at least the third thickness at the third region, the third thickness is less than the second thickness, the third set of word lines is formed above the second set of word lines. The thickness of the blocking dielectric in any given zone is less than that of the blocking dielectric in any underlying zone.

After all of the sacrificial layers have been removed, the word line layers can be formed in the voids via the slits at step 1112. The slits can be filled at step 1114. In one embodiment, the gate oxide for the source side select transistors may be formed prior to forming the word line layers. Additionally, an additional blocking layer such as aluminum oxide may be formed by depositing using ALD from outside of the memory hole through the slits. In one embodiment, a titanium nitride barrier layer may be deposited in the holes where the sacrificial material was removed.

The word lines can be formed in one embodiment by depositing metal (one or more layers in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal. In one embodiment, first a tungsten nucleation layer is formed, then tungsten is deposited by CVD. A tungsten etch can be performed to remove tungsten from the top of the stack and the side walls, while the tungsten remains in the word lines. A word line side wall oxide deposition can be performed as well, followed by an oxide etch to remove the oxide from the horizontal regions. After forming the word lines, the slits are refilled. A tungsten recess may be performed to isolate the word lines. Also a cover dTEOS may be deposited by CVD. In one embodiment, the slits are filled with polysilicon. The polysilicon can be recessed some amount in the slit and the remaining slit filled with tungsten.

Accordingly, an apparatus has been described, including a substrate, and a plurality of word line layers arranged alternatingly with a plurality of dielectric layers in a stack over the substrate. The plurality of word line layers include a first word line layer formed below a second word line layer. The first word line layer has a first gate length that is smaller than a second gate length of the second word line layer. The apparatus includes a first memory hole extending vertically through at least a portion of the stack. The memory hole has a diameter that decreases from an upper region of the stack to a lower region of the stack.

A method has been described that includes forming a plurality of word line layers arranged alternatingly with a plurality of dielectric layers in a stack over a substrate. The plurality of word line layers include a first word line layer formed below a second word line layer. The first word line layer has a thickness that is less than a thickness of the second word line layer. The method includes forming a first memory hole extending vertically through at least a portion of the stack. The memory hole has a diameter that decreases from an upper region of the stack to a lower region of the stack.

An apparatus has been described that includes a substrate, and a plurality of word line layers arranged alternatingly with a plurality of dielectric layers in a stack over the substrate. The plurality of word lines layers includes a first word line formed below a second word line. The apparatus includes a first memory hole extending vertically through at least a portion of the stack. The memory hole has a diameter that decreases from an upper region of the stack to a lower region of the stack. The apparatus includes a blocking dielectric formed in the first memory hole. The blocking dielectric has a first thickness adjacent to the first word line and a second thickness adjacent to the second word line. The second thickness is less than the first thickness.

A method has been described that includes forming a plurality of word line layers arranged alternatingly with a plurality of dielectric layers in a stack over a substrate. The plurality of word line layers includes a first word line formed below a second word line. The method includes forming a first memory hole extending vertically through at least a portion of the stack. The memory hole has a diameter that progressively increases with a distance from a surface of the substrate. The method includes forming a blocking dielectric in the first memory hole. The blocking dielectric has a first thickness adjacent to the first word line and a second thickness adjacent to the second word line. The second thickness is less than the first thickness.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
a substrate;
a plurality of word line layers arranged alternatingly with a plurality of dielectric layers in a stack over the substrate, the plurality of word line layers including a first word line formed below a second word line;
a first memory hole extending vertically through at least a portion of the stack, the memory hole having a diameter that decreases from an upper region of the stack to a lower region of the stack; and a blocking dielectric formed in the first memory hole, the blocking dielectric having a first thickness adjacent to the first word line and a second thickness adjacent to the second word line, the second thickness is less than the first thickness.

2. The apparatus of claim 1, wherein:
the first memory hole is columnar and extends at least from a top word line layer of the plurality to a bottom word line layer of the plurality;
the blocking dielectric extends from at least the top word line layer to the bottom word line layer; and
the blocking dielectric is tapered with a thickness that is progressively smaller from a region adjacent to the top word line layer to a region adjacent to the bottom word line layer.

3. The apparatus of claim 2, wherein:
the blocking dielectric thickness varies continuously from the region adjacent to the top word line layer to the region adjacent to the bottom word line layer.

4. The apparatus of claim 1, wherein:
the first memory hole is columnar and extends at least from a top word line layer of the plurality to a bottom word line layer of the plurality;
the blocking dielectric extends from at least the top word line layer to the bottom word line layer;
the blocking dielectric includes a first region adjacent to a first set of word lines of the plurality, the blocking dielectric having at least the first thickness at the first region, the first set of word lines includes the first word line;
the blocking dielectric includes a second region adjacent to a second set of word lines of the plurality, the blocking dielectric having at least the second thickness at the second region, the second set of word lines includes the second word line and is formed above the first set of word lines; and
the blocking dielectric includes a third region adjacent to a third set of word lines of the plurality, the blocking dielectric having at least the third thickness at the third region, the third thickness is less than the second thickness, the third set of word lines is formed above the second set of word lines.

5. The apparatus of claim 1, further comprising:
a plurality of memory holes extending through the stack and including the first memory hole, the memory holes have diameters which are progressively smaller closer to a bottom of the stack, the memory holes are columnar and extend at least from a top word line layer of the plurality of word line layers to a bottom word line layer of the plurality of word line layers; and
a plurality of NAND strings arranged along the memory holes, the NAND strings comprise a plurality of memory cells in communication with the plurality of word line layers,
wherein the plurality of memory holes and the plurality of word line layers comprise a non-volatile memory array arranged in a three dimensional structure.

6. The apparatus of claim 5, wherein:
each NAND string is U-shaped and comprises a source-side column and a drain-side column, each source-side column is arranged along one of the memory holes and each drain-side column is arranged along one of the memory holes.

7. The apparatus of claim 5, wherein:
each NAND string is straight.

8. The apparatus of claim 1, wherein:
the first memory hole is filled with a plurality of annular layers comprising the blocking dielectric, a charge trapping layer, a tunneling layer and a channel layer;
a core region of the first memory hole is filled with a body material, the plurality of annular layers are between the core region and the word line layers in the first memory hole; and
the diameter of the first memory hole varies based on a diameter of the core region.

9. The apparatus of claim 1, wherein:
the first memory hole is filled with the blocking dielectric, a charge trapping layer, a tunnel oxide layer and a channel layer.

* * * * *